US009721996B2

(12) United States Patent
Kabe et al.

(10) Patent No.: US 9,721,996 B2
(45) Date of Patent: Aug. 1, 2017

(54) DISPLAY DEVICE

(71) Applicant: Japan Display Inc., Minato-ku (JP)

(72) Inventors: Masaaki Kabe, Minato-ku (JP);
Hidemasa Yamaguchi, Minato-ku (JP);
Kojiro Ikeda, Minato-ku (JP); Akira Sakaigawa, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 14/952,167

(22) Filed: Nov. 25, 2015

(65) Prior Publication Data

US 2016/0155777 A1 Jun. 2, 2016

(30) Foreign Application Priority Data

Nov. 28, 2014 (JP) .................. 2014-242432

(51) Int. Cl.
*H01L 27/32* (2006.01)
*G09G 3/32* (2016.01)

(52) U.S. Cl.
CPC .............. *H01L 27/32* (2013.01); *G09G 3/32* (2013.01); *H01L 27/3216* (2013.01); *H01L 27/3218* (2013.01); *H01L 27/3244* (2013.01)

(58) Field of Classification Search
CPC .................................................. H01L 27/156
See application file for complete search history.

(56) References Cited

U.S. PATENT DOCUMENTS

| 8,552,635 B2 | 10/2013 | Kim et al. |
| 2009/0315921 A1 | 12/2009 | Sakaigawa et al. |
| 2011/0291550 A1 | 12/2011 | Kim et al. |
| 2014/0204008 A1* | 7/2014 | Chu-Ke ............ G09G 3/2003 345/88 |

FOREIGN PATENT DOCUMENTS

| JP | 2010-33009 | 2/2010 |
| JP | 2011-249334 | 12/2011 |

* cited by examiner

*Primary Examiner* — Matthew Reames
(74) *Attorney, Agent, or Firm* — Oblon, McClelland, Maier & Neustadt, L.L.P.

(57) ABSTRACT

A display device includes a display unit in which pixels are arranged in a matrix. The pixels each include a first sub-pixel having the largest area among sub-pixels, a second sub-pixel adjacent to the first sub-pixel and having an area smaller than that of the first sub-pixel, and a third sub-pixel adjacent to the first and second sub-pixels, having an area smaller than that of the first sub-pixel, and arranged in the same column as that of second sub-pixels. First, second, and third pixels are aligned in at least one of a column direction or a row direction and each include the first, second, and third sub-pixels that can display different one of first, second, and third colors. Areas of the first, second, and third colors displayable by the first, second, and third pixels in total are equal to one another.

8 Claims, 15 Drawing Sheets

DISPLAY DEVICE

CROSS-REFERENCE TO RELATED APPLICATIONS

This application claims priority from Japanese Application No. 2014-242432, filed on Nov. 28, 2014, the contents of which are incorporated by reference herein in its entirety.

BACKGROUND

1. Technical Field

The present invention relates to a display device.

2. Description of the Related Art

There has recently been an increasing demand for display devices designed for mobile apparatuses and the like, such as mobile phones and electronic paper. Each pixel in a display device includes a plurality of sub-pixels that emit light of respective colors. The sub-pixels in the display device are turned on and off to display various colors on the pixel. For example, a pixel includes sub-pixels of three different colors and the same shape, and the sub-pixels are arrayed in three columns. In such a sub-pixel array, an increase in the pixel density may possibly reduce an aperture ratio.

In the publicly-known technology of a display device, a pixel includes sub-pixels of three different colors and different shapes, and the sub-pixels are arrayed in two columns. In such a sub-pixel array, an increase in the pixel density hardly reduces the aperture ratio. The balance of colors, however, may possibly be lost because of the different shapes of the sub-pixels.

SUMMARY

According to an aspect, display device includes a display unit in which a plurality of pixels are arranged in a matrix. The pixels each include a first sub-pixel having a largest area among sub-pixels, a second sub-pixel adjacent to the first sub-pixel and having an area smaller than the area of the first sub-pixel, and a third sub-pixel adjacent to the first sub-pixel and the second sub-pixel, having an area smaller than the area of the first sub-pixel, and arranged in a same column of sub-pixels as a column of second sub-pixels. A first pixel, a second pixel, and a third pixel among the pixels are aligned in at least one of a column direction or a row direction and each include the first sub-pixel, the second sub-pixel, and the third sub-pixel that are capable of displaying different one of a first color, a second color, and a third color. Areas of the first color, the second color, and the third color displayable by the first pixel, the second pixel, and the third pixel in total are equal to one another.

BRIEF DESCRIPTION OF THE DRAWINGS

FIG. 5 is a timing chart illustrating drive of the display device according to the embodiment;

DETAILED DESCRIPTION

Figure 1:
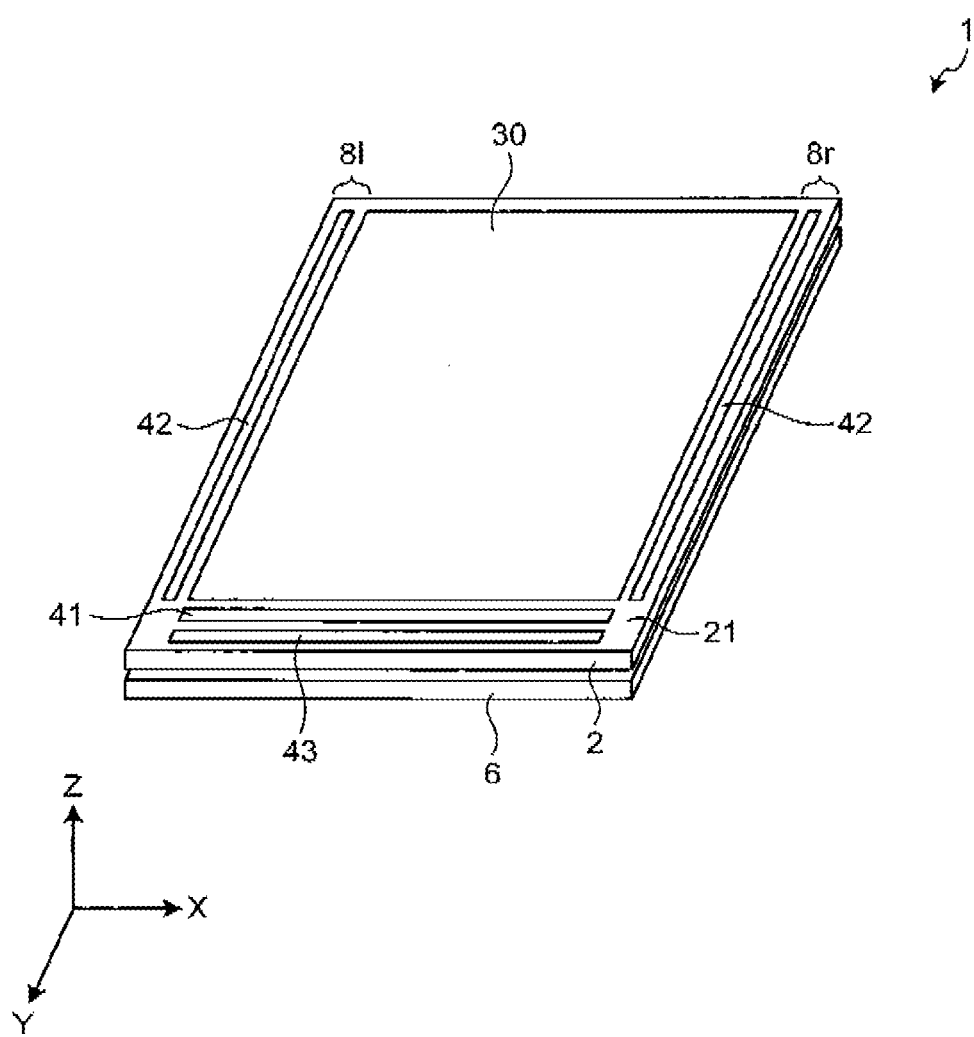
FIG. 1 is a diagram illustrating an example of a display device according to an embodiment of the present invention.

A mode for carrying out the present invention (embodiment) will be described in detail with reference to the drawings. The present invention is not limited to contents described in the following embodiment. Components described below include a component that can be easily conceived by those skilled in the art, a component that is substantially identical thereto. Furthermore, the components described below may be appropriately combined. The disclosure is merely an example and an appropriate modification without departing from the gist of the present invention which can be conceived by those skilled in the art is naturally included in the scope of the present invention. Width, thickness, a shape and the like of each unit may be schematically illustrated as compared to those of an actual mode in the drawings in order to make the illustration clearer; however, this is merely an example and this does not limit the interpretation of the present invention. In the specification and drawings, the same reference numeral may be assigned to a component similar to that which has already been described with reference to an already presented drawing, and the detailed description thereof may be appropriately omitted.

Figure 2:
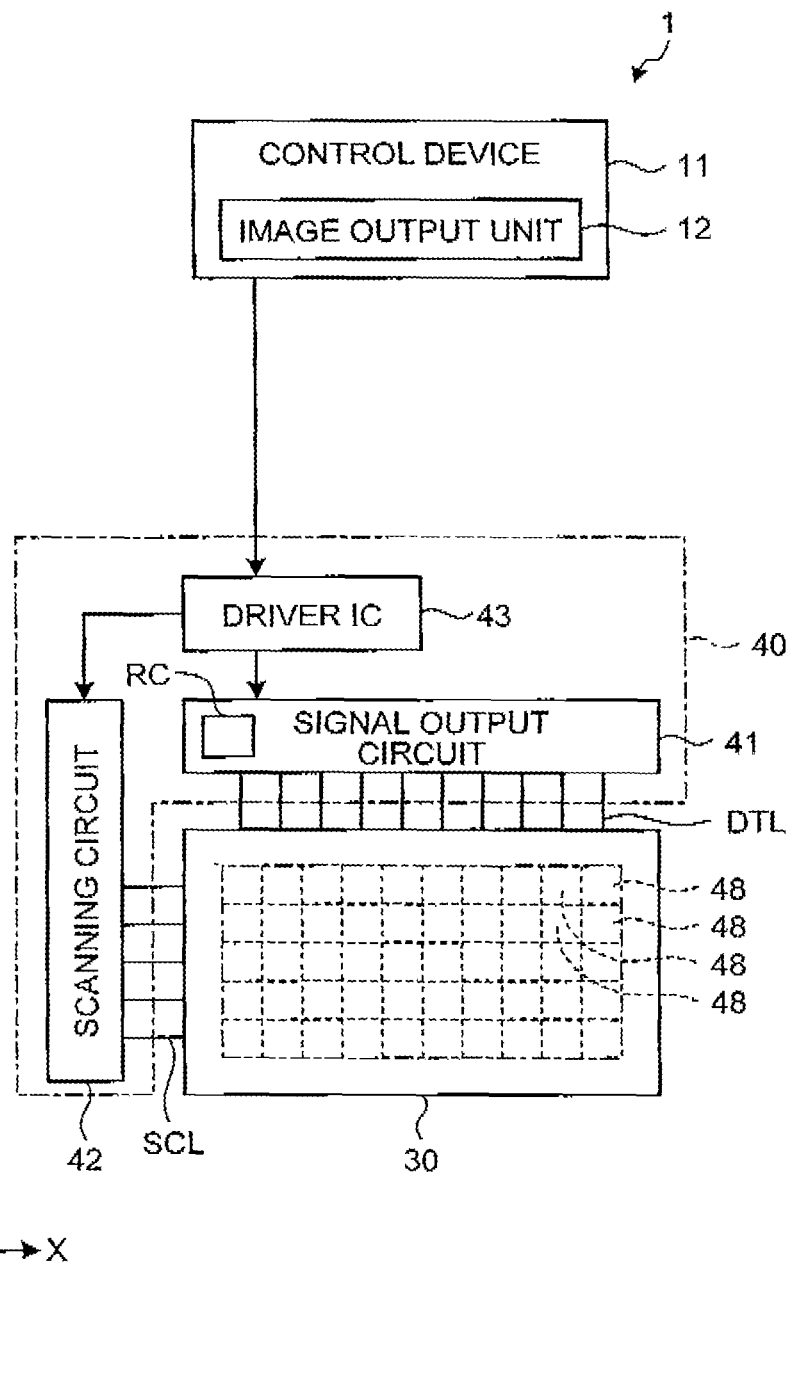
FIG. 2 is a block diagram of a configuration example of the display device according to the embodiment.

FIG. 1 is a diagram illustrating an example of a display device according to an embodiment of the present invention. FIG. 2 is a block diagram of a configuration example of the display device according to the embodiment. FIGS. 1 and 2 schematically illustrate the display device, and the size and shape thereof in the figures are not necessarily the same as those in an actual display device. A display device 1 corresponds to a specific example of the "display device" according to the present invention.

The display device 1 includes a display unit 2, a driver integrated circuit (IC) 43, and a backlight 6. The display device 1 may be a transmissive or transflective display device or may be a reflective display device not including the backlight 6. Flexible printed circuits (FPCs), which are not illustrated, transmit an external signal to the driver IC 43 or electric power for driving the driver IC 43. The display unit 2 includes a translucent insulation substrate such as a glass substrate 21, a display area 30, a signal output circuit 41, and a scanning circuit 42. The display area 30 is provided on a surface of the glass substrate 21 and has a large number of pixels arranged in a matrix (rows and columns). Two scanning circuits 42 are provided in a manner sandwiching the display area 30 in FIG. 1, but only one scanning circuit 42 may be provided. The glass substrate 21 includes a first substrate and a second substrate. In the first substrate, a large number of pixel circuits including an active element (e.g., a transistor) are arranged in a matrix. The second substrate is arranged facing the first substrate with a predetermined gap interposed therebetween. The glass substrate 21 includes a liquid-crystal layer in which liquid crystals are sealed between the first substrate and the second substrate. The display device 1 is not limited to such a liquid-crystal display device and may be a display device that emits light from a light emitter, such as an organic light-emitting diode (OLED). In this case, the display device 1 does not require the backlight 6 because the display unit 2 can emit light by itself. The signal output circuit 41 and the scanning circuit 42 serve as a driver circuit 40, which will be described below. The signal output circuit 41 and the scanning circuit 42 are also referred to as peripheral circuits because they are formed on the periphery of the display area 30.

Frame areas 8r and 8l are non-display area formed on a plane of the glass substrate 21 and outside the display area 30 including a large number of pixels arranged in a matrix (rows and columns). The scanning circuits 42 are arranged on the frame areas 8r and 8l. In the embodiment, an X-direction indicates a direction on a plane of the display unit 2, a Y-direction indicates a direction orthogonal to the X-direction, and a Z-direction indicates a direction orthogonal to the X-Y plane. The arrangement positions of the scanning circuits 42, the signal output circuit 41, and the driver IC 43 are not limited to those illustrated in FIG. 1.

The backlight 6 is arranged on the back surface side (surface opposite to a surface on which an image is displayed in the Z-direction) of the display unit 2. The backlight 6 outputs light to the display unit 2 in response to a control signal from a control device 11, which will be described below, whereby the light is incident on the display area 30. The backlight 6 includes, for example, a light source and a light guide plate that guides light output from the light source to the back surface of the display unit 2. The backlight 6 may include a plurality of light sources aligned in the X-direction or the Y-direction. In this case, the amounts of light from the light sources may be individually controlled. With this configuration, the backlight 6 can cause light emitted from a part of the light sources to be incident on a part of the display unit 2. The display device 1 according to the embodiment includes the backlight 6 arranged on the back surface side of the display unit 2 as the light source. Alternatively, the display device 1 may include a front light arranged on the front surface side of the display unit 2.

The display unit 2 includes the display area 30, the driver IC 43, a first scanning circuit 42, a second scanning circuit 42, and the signal output circuit 41 on the glass substrate 21. The driver IC 43 has functions of an interface (I/F) and a timing generator. Only one of the first scanning circuit 42 and the second scanning circuit 42 may be provided, and thus they are hereinafter collectively referred to as the scanning circuit 42.

As illustrated in FIG. 2, the display area 30 has a matrix (row-and-column) structure in which m (row)×n (column) pixels are arranged. The row in the display device 1 according to the embodiment indicates a row composed of n pixels 48 aligned in a direction. The column indicates a column composed of m pixels 48 aligned in a direction orthogonal to the direction in which the row extends. The values of m and n are determined based on the display resolutions in the vertical direction and the horizontal direction. The display area 30 has scanning lines SCL and signal lines DTL arranged in an area overlapping with a black matrix of a color filter viewed in a direction orthogonal to the front surface. In the display area 30, an area not provided with the black matrix corresponds to an aperture portion.

The display unit 2 receives a master clock, a horizontal synchronization signal, and a vertical synchronization signal as external signals from the outside and supplies them to the driver IC 43. The driver IC 43 converts the levels (increases the voltages) of the master clock, the horizontal synchronization signal, and the vertical synchronization signal at the voltage amplitude of an external power source into levels at the voltage amplitude of an internal power source required to drive the liquid crystals. In this manner, the driver IC 43 generates the master clock, the horizontal synchronization signal, and the vertical synchronization signal. The driver IC 43 transmits the generated master clock, the generated horizontal synchronization signal, and the generated vertical synchronization signal to the scanning circuit 42 and the signal output circuit 41. The driver IC 43 generates a common potential (counter electrode potential) applied in common to pixel electrodes in respective sub-pixels of the pixels 48 and supplies it to the display area 30.

The scanning circuit 42 includes a shift register and a latch circuit, for example. The latch circuit in the scanning circuit 42 sequentially samples and latches, in one horizontal period, display data output from the driver IC 43 in synchronization with a vertical clock pulse. The scanning circuit 42 sequentially outputs digital data of one line latched by the latch circuit as a vertical scanning pulse. The scanning circuit 42 then supplies the vertical scanning pulse to the scanning lines SCL in the display area 30, thereby sequentially selecting the sub-pixels included in the pixels 48 row by row. The scanning circuit 42 supplies the pulse to the scanning lines SCL sequentially from the top, thereby sequentially scanning the gates of the pixels coupled to the scanning lines SCL.

The signal output circuit 41 is supplied with 8-bit digital video data of red (R), green (G), and blue (B), for example. The signal output circuit 41 writes, via the signal lines DTL, display data to the sub-pixels included in the pixels of a row selected in the vertical scanning performed by the scanning circuit 42, in units of a pixel, a plurality of pixels, or all the pixels.

The control device 11 includes a central processing unit (CPU) serving as a calculation unit and a memory serving as a storage device, for example. The control device 11 uses these hardware resources to execute a computer program, thereby providing various functions. More specifically, the control device 11 reads a computer program stored in the storage device to load it on the memory and causes the CPU to execute an instruction included in the computer program loaded on the memory. The control device 11 serves as an image output unit 12 so as to enable the driver IC 43 to handle an image to be displayed on the display area 30 as information on an image input gradation, based on the result of execution of the instruction by the CPU.

Figure 3A:
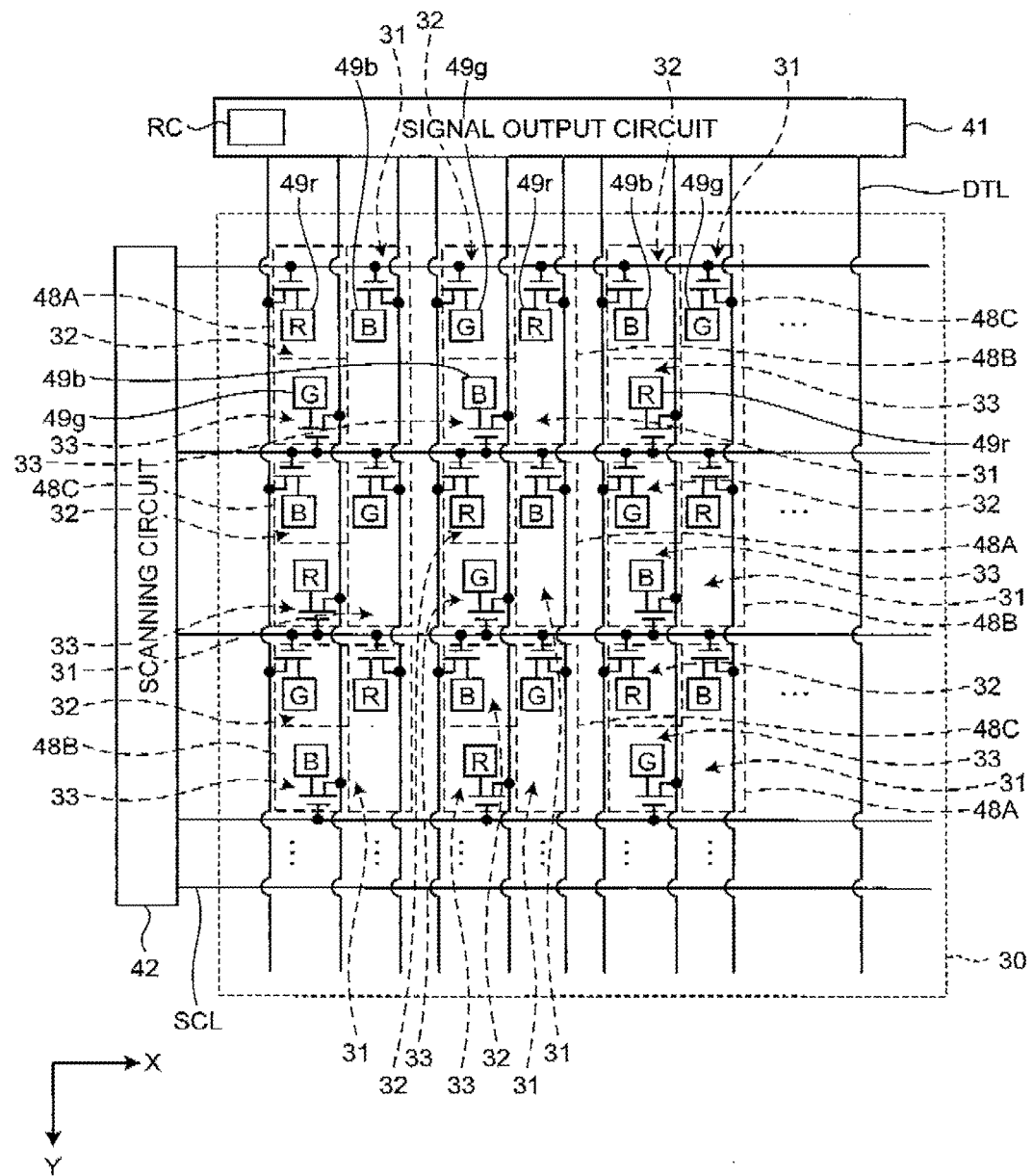
FIG. 3A is a conceptual diagram of a display unit and a drive circuit of the display unit according to the embodiment.
Figure 3B:
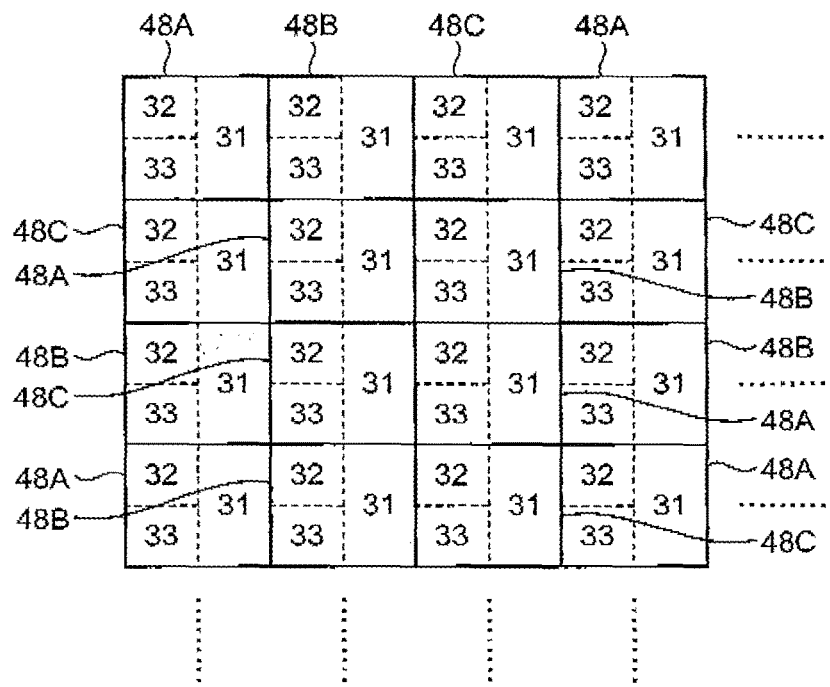
FIG. 3B is a diagram schematically illustrating sub-pixels in the display unit illustrated in FIG. 3A.
Figure 3C:
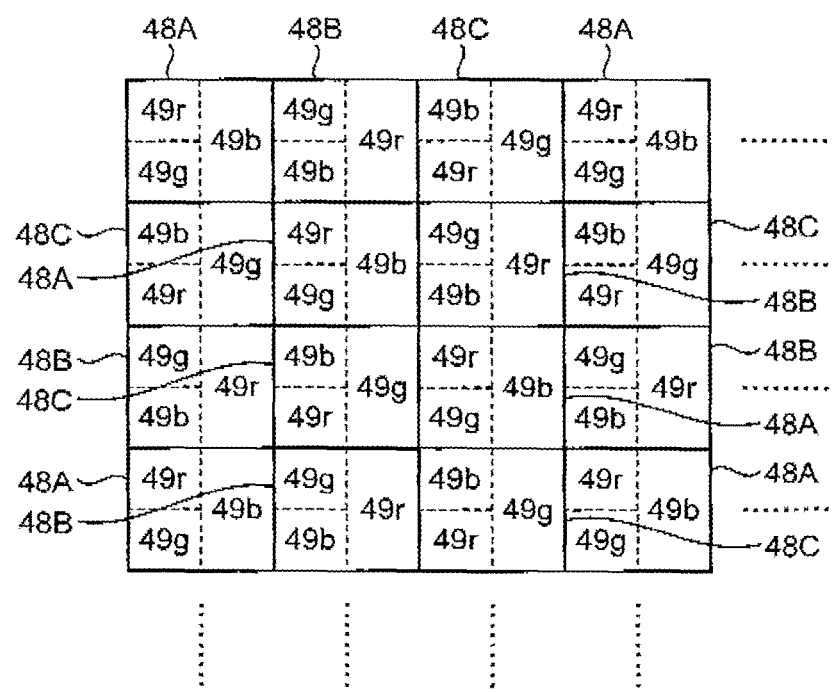
FIG. 3C is a diagram illustrating colors displayable by the respective sub-pixels in the display unit illustrated in FIG. 3B.
Figure 4:
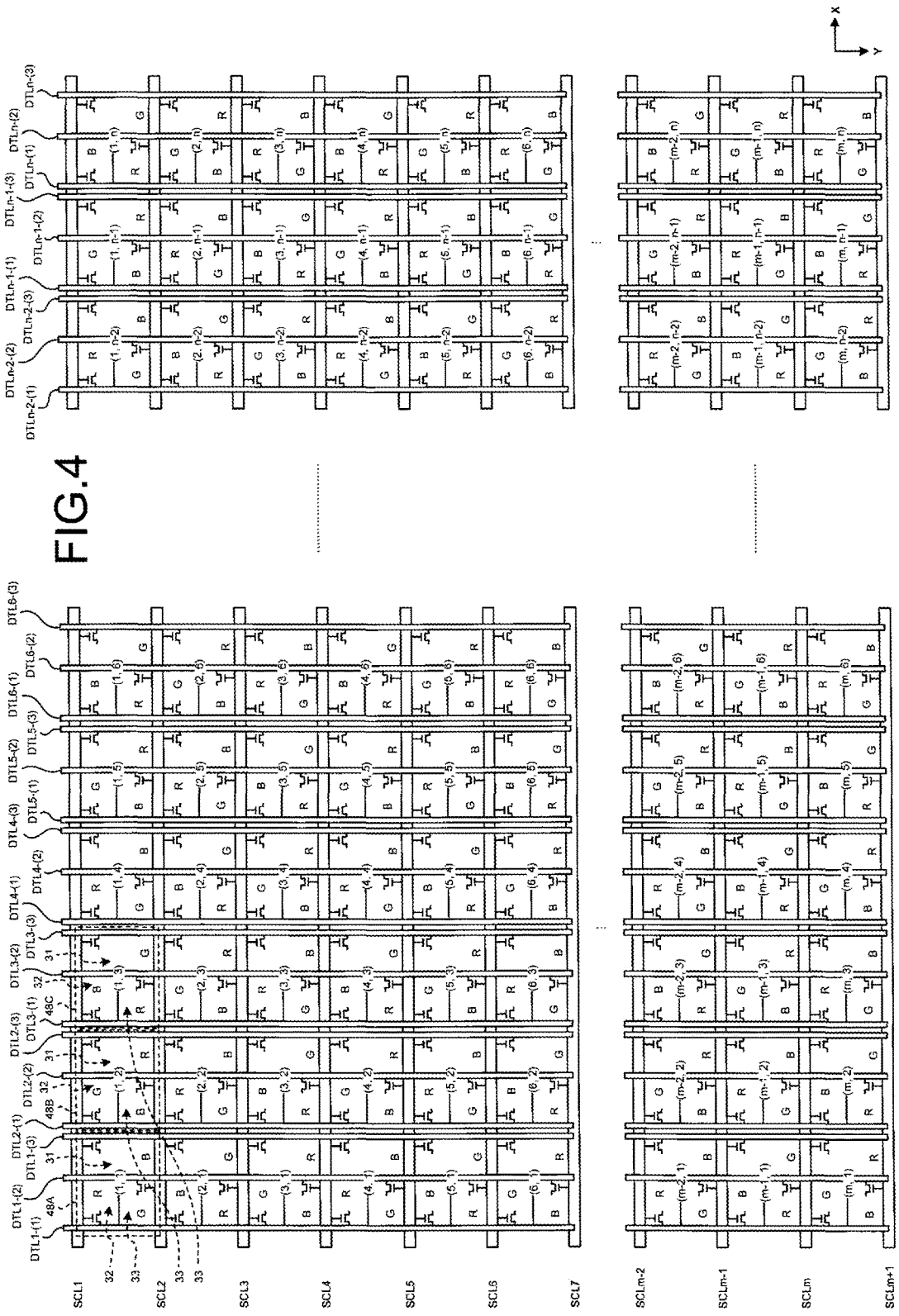
FIG. 4 is a diagram illustrating an array of pixels in the display unit according to the embodiment.

FIG. 3 is a conceptual diagram of the display unit and a drive circuit of the display unit according to the embodiment. FIG. 4 is a diagram illustrating an array of pixels in the display unit according to the embodiment. FIG. 3B is a diagram schematically illustrating sub-pixels in the display unit illustrated in FIG. 3A. FIG. 3C is a diagram illustrating colors displayable by the respective sub-pixels in the display unit illustrated in FIG. 3B. As illustrated in FIGS. 3A and 3C, the pixels 48 include a pixel 48A, a pixel 48B, and a pixel 48C. The types of the pixels 48 are determined depending on which position of a first sub-pixel 31, a second sub-pixel 32, and a third sub-pixel 33 illustrated in FIG. 3B, a sub-pixel 49r, a sub-pixel 49g, and a sub-pixel 49b that display different colors are allocated to. In the display area 30, $P_0$ (row)×$Q_0$ (column) pixels 48 including the pixel 48A, the pixel 48B, and the pixel 48C are arrayed in a two-dimensional matrix. In the example illustrated in FIGS. 2, 3A, 3B, and 3C, pixels 48A, pixels 48B, and pixels 48C are arrayed in this order in the row direction and the column direction on the two-dimensional XY coordinate system, whereby the pixels 48 are arrayed in a matrix. In this example, the row direction corresponds to the X-direction, whereas the column direction corresponds to the Y-direction.

As illustrated in FIGS. 3A and 3B, the pixels 48A, 48B, and 48C each include the first sub-pixel 31, the second sub-pixel 32, and the third sub-pixel 33. The first sub-pixel 31 has the largest area among the first sub-pixel 31, the second sub-pixel 32, and the third sub-pixel 33. The second sub-pixel 32 has an area smaller than that of the first sub-pixel 31 and is adjacent to the first sub-pixel 31. The third sub-pixel 33 is adjacent to the first sub-pixel 31 and the second sub-pixel 32 and has an area smaller than that of the first sub-pixel 31. The combination of the first sub-pixel 31, the second sub-pixel 32, and the third sub-pixel 33 constitute a polygonal pixel. Examples of the polygon include a rectangle, a square, an oblong, and a parallelogram. Examples of the polygonal pixel include a pixel having a pair of two bent sides constituting a rectangle. The area of the third sub-pixel 33 may be larger than, smaller than, or equal to that of the second sub-pixel 32. The outer shape of a pixel composed of the first sub-pixel 31, the second sub-pixel 32, and the third sub-pixel 33 may be bent or curved along the shape of the scanning lines SCL and the signal lines DTL.

As illustrated in FIGS. 3A and 3B, the second sub-pixel 32 and the third sub-pixel 33 are aligned in a single column. In the column, the second sub-pixels 32 and the third sub-pixels 33 are alternately arranged. In another single column, the first sub-pixels 31 of the respective pixels 48 are successively arranged. The column in which the second sub-pixels 32 and the third sub-pixels 33 are alternately arranged and the column in which the first sub-pixels 31 are arranged are alternately arranged. The second sub-pixel 32 and the third sub-pixel 33 have the same width in the X-direction.

In the display area 30 according to the embodiment, for example, the sub-pixels 49r, 49g, and 49b are designed to be capable of displaying different colors, i.e., R as a second color, G as a third color, and B as a first color. The sub-pixels 49r, 49g, and 49b are arranged at the positions of the first sub-pixel 31, the second sub-pixel 32, and the third sub-pixels 33 as illustrated in FIGS. 3A, 3B, 3C, and 4. The second color of the sub-pixel 49r, for example, is determined by light passing through a color filter of R. The third color of the sub-pixel 49g is determined by light passing through a color filter of G. The first color of the sub-pixel 49b is determined by light passing through a color filter of B. In a case where the display device 1 is a display device that emits light from a light emitter, such as an OLED, the second color may be emitted from a luminescent substance of R, the third color may be emitted from a luminescent substance of G, and the first color may be emitted from a luminescent substance of B. To provide reddish (R) light, for example, a luminescent substance that emits light having a peak of an emission spectrum at 600 nm to 680 nm may be used. Examples of the luminescent substance include 4-dicyanomethylene-2-isopropyl-6-[2-(1,1,7,7-tetramethyljulolidine-9-yl)ethenyl]-4H-pyran (abbreviation: DCJTI), 4-dicyanomethylene-2-methyl-6-[2-(1,1,7,7-tetramethyljulolidine-9-yl)ethenyl]-4H-pyran (abbreviation: DCJT), 4-dicyanomethylene-2-tert-butyl-6-[2-(1,1,7,7-tetramethyljulolidine-9-yl)ethenyl]-4H-pyran (abbreviation: DCJTB), periflanthene, and 2,5-dicyano-1,4-bis[2-(10-methoxy-1,1,7,7-tetramethyljulolidine-9-yl)ethenyl]benzene. To provide greenish (G) light, a luminescent substance that emits light having a peak of an emission spectrum at 500 nm to 550 nm may be used. Examples of the luminescent substance include N,N'-dimethylquinacridone (abbreviation: DMQd), coumalin 6, coumalin 545T, and tris(8-quinolinolato)aluminum (abbreviation: $Alq_3$). To provide bluish (B) light, a luminescent substance that emits light having a peak of an emission spectrum at 420 nm to 500 nm may be used. Examples of the luminescent substance include 9,10-bis(2-naphtyl)-text-butylanthracene (abbreviation: t-BuDNA), 9,9'-bianthryl, 9,10-diphenylanthracene (abbreviation: DPA), 9,10-bis(2-naphtyl)-anthracene (abbreviation: DNA), bis(2-methyl-8-quinolinolato)-4-phenylphenolate-gallium (abbreviation: BGaq), and bis(2-methyl-8-quinolinolato)-4-phenylphenolate-aluminum (abbreviation: BAlq).

In the pixel 48A according to the embodiment, as illustrated in FIGS. 3A, 3B, 3C, and 4, the first sub-pixel 31 corresponds to the sub-pixel 49b that can display the first color, the second sub-pixel 32 corresponds to the sub-pixel 49r that can display the second color, and the third sub-pixel 33 corresponds to the sub-pixel 49g that can display the third color. In the pixel 48B, the first sub-pixel 31 corresponds to the sub-pixel 49r that can display the second color, the second sub-pixel 32 corresponds to the sub-pixel 49g that can display the third color, and the third sub-pixel 33 corresponds to the sub-pixel 49b that can display the first color. In the pixel 48C, the first sub-pixel 31 corresponds to the sub-pixel 49g that can display the third color, the second sub-pixel 32 corresponds to the sub-pixel 49b that can display the first color, and the third sub-pixel 33 corresponds to the sub-pixel 49r that can display the second color. Thus, the pixels 48A, 48B, and 48C each include the sub-pixels 49r, 49g, and 49b of three different colors. The pixels 48A, 48B, and 48C each include the first sub-pixel 31, the second sub-pixel 32, and the third sub-pixel 33. The second sub-pixel 32 and the third sub-pixel 33 are arranged in a column of sub-pixels next to that of the first sub-pixel 31 and have a shape different at least from that of the first sub-pixel 31. The first sub-pixel 31, the second sub-pixel 32, and the third sub-pixel 33 are arranged in one row and one column of a pixel.

As illustrated in FIG. 4, the scanning lines SCL described above include scanning lines SCL1, SCL2, SCL3, SCL4, SCL5, SCL6, SCL7, . . . , SCLm−2, SCLm−1, SCLm, and SCLm+1 extending in the X-direction. In other words, the scanning lines SCL include scanning lines SCLp where $1 \leq p \leq m+1$ is satisfied. Similarly, the signal lines DTL include signal lines DTL1-(1), DTL1-(2), DTL1-(3), DTL2-(1), DTL2-(2), DTL2-(3), DTL3-(1), DTL3-(2), DTL3-(3), DTL4-(1), DTL4-(2), DTL4-(3), DTL5-(1), DTL5-(2), DTL5-(3), DTL6-(1), DTL6-(2), DTL6-(3), DTLn−2-(1), DTLn−2-(2), DTLn−2-(3), DTLn−1-(1), DTLn−1-(2), DTLn−1-(3), DTLn-(1), DTLn-(2), and DTLn-(3). The pixels 48 include a pixel (1,1), . . . , a pixel (m,n). A certain pixel is referred to as a pixel ($P_0$, $Q_0$) where $1 \leq P_0 \leq m$ and $1 \leq Q_0 \leq n$ are satisfied.

A signal line DTLq-(1) ($1 \leq q \leq n$) is coupled to the switching element of the second sub-pixel 32. A signal line DTLq-(2) ($1 \leq q \leq n$) is coupled to the switching element of the third sub-pixel 33. A signal line DTLq-(3) ($1 \leq q \leq n$) is coupled to the switching element of the first sub-pixel 31.

As illustrated in FIG. 4, for example, the first column of sub-pixels has the second sub-pixels 32 and the third sub-pixels 33 aligned alternately in the Y-direction between the scanning line SCL1 and the scanning line SCL2 arranged adjacent to each other. Similarly to the first column of sub-pixels, odd-numbered columns of sub-pixels each have the second sub-pixels 32 and the third sub-pixels 33 aligned alternately in the Y-direction. The second column of sub-pixels has the first sub-pixels 31 aligned in the Y-direction between the scanning line SCL1 and the scanning line SCL2. Similarly to the second, column of sub-pixels, even-numbered columns of sub-pixels each have the first sub-pixels 31 aligned in the Y-direction. Alternatively, the odd-numbered columns of sub-pixels may each have the first sub-pixels 31 aligned in the Y-direction, and the even-numbered columns of sub-pixels may each have the second sub-pixels 32 and the third sub-pixels 33 aligned alternately in the Y-direction.

The pixels 48A, 48B, and 48C are repeatedly arranged in this order in the X-direction in FIG. 4. The sub-pixel 49r that can display the second color is arranged on the second sub-pixel 32 in the pixel 48A, the first sub-pixel 31 in the pixel 48B, and the third sub-pixel 33 in the pixel 48C in a manner of shifting its position in the clockwise direction in the order of the pixels 48A, 48B, and 48C. The sub-pixel 49g that can display the third color is arranged on the third sub-pixel 33 in the pixel 48A, the second sub-pixel 32 in the pixel 48B, and the first sub-pixel 31 in the pixel 48C in a manner of shifting its position in the clockwise direction in the order of the pixels 48A, 48B, and 48C. The sub-pixel 49b that can display the first color is arranged on the first sub-pixel 31 in the pixel 48A, the third sub-pixel 33 in the pixel 48B, and the second sub-pixel 32 in the pixel 48C in a manner of shifting its position in the clockwise direction in the order of the pixels 48A, 48B, and 48C.

The pixels 48A, 48B, and 48C are repeatedly arranged in the order of the pixels 48C, 48B, and 48A in the Y-direction in FIG. 4. As a result, the pixel 48A is adjacent only to the pixel 48B and the pixel 48C in the X-direction and the Y-direction. The pixel 48B is adjacent only to the pixel 48C and the pixel 48A in the X-direction and the Y-direction. The pixel 48C is adjacent only to the pixel 48A and the pixel 48B in the X-direction and the Y-direction.

In the pixels 48A and 48B arranged adjacent to each other in the X-direction or the Y-direction, the first sub-pixel 31 in the pixel 48A can display blue (B), whereas the first sub-pixel 31 in the pixel 48B can display red (R). The second sub-pixel 32 in the pixel 48A can display red (R), whereas the second sub-pixel 32 in the pixel 48B can display green (G). The third sub-pixel 33 in the pixel 48A can display green (G), whereas the third sub-pixel 33 in the pixel 48B can display blue (B).

In the pixels 48B and 48C arranged adjacent to each other in the X-direction or the Y-direction, the first sub-pixel 31 in the pixel 48B can display red (R), whereas the first sub-pixel 31 in the pixel 48C can display green (G). The second sub-pixel 32 in the pixel 48B can display green (G), whereas the second sub-pixel 32 in the pixel 48C can display blue (B). The third sub-pixel 33 in the pixel 48B can display blue (B), whereas the third sub-pixel 33 in the pixel 48C can display red (R).

In the pixels 48C and 48A arranged adjacent to each other in the X-direction or the Y-direction, the first sub-pixel 31 in the pixel 48C can display green (G), whereas the first sub-pixel 31 in the pixel 48A can display blue (B). The second sub-pixel 32 in the pixel 48C can display blue (B), whereas the second sub-pixel 32 in the pixel 48A can display red (R). The third sub-pixel 33 in the pixel 48C can display red (R), whereas the third sub-pixel 33 in the pixel 48A can display green (G).

In comparison between the pixels 48A and 48B arranged adjacent to each other in the X-direction or the Y-direction, the first sub-pixels 31, the second sub-pixels 32, and the third sub-pixels 33 display different colors between the pixels. In comparison between the pixels 48B and 48C arranged adjacent to each other in the X-direction or the Y-direction, the first sub-pixels 31, the second sub-pixels 32, and the third sub-pixels 33 display different colors between the pixels. In comparison between the pixels 48C and 48A arranged adjacent to each other in the X-direction or the Y-direction, the first sub-pixels 31, the second sub-pixels 32, and the third sub-pixels 33 display different colors between the pixels. This configuration enables the first sub-pixels 31, the second sub-pixels 32, and the third sub-pixels 33 to display the same number of R, G, and B colors in the pixels 48A, 48B, and 48C aligned successively in at least one of the column direction or the row direction. As a result, the areas of the respective sub-pixels that display R, G, and B colors are equal in the pixels 48A, 48B, and 48C aligned successively in at least one of the column direction or the row direction.

The pixels 48A, 48B, and 48C are each aligned in a diagonal direction toward lower right in FIG. 4. For example, the first sub-pixel 31 of a certain pixel 48B can display the second color, the second sub-pixel 32 thereof can display the third color, and the third sub-pixel 33 thereof can display the first color. In this case, a pixel adjacent to the certain pixel in the diagonal direction toward lower right is also a pixel 48B. Thus, the first sub-pixel 31 of this adjacent pixel can display the second color, the second sub-pixel 32 thereof can display the third color, and the third sub-pixel 33 thereof can display the first color. With this configuration, the same displayable color is not provided successively in the X-direction or the Y-direction. Thus, it is possible to make lines having the same displayable color hardly recognized.

As illustrated in FIGS. 3A, 3B, 3C, and 4, for example, the scanning line SCL1 is coupled to the switching element of the sub-pixel 49r that can display the second color in a pixel 48A and to the switching element of the sub-pixel 49b that can display the first color in the next column in the pixel 48A. The switching element of the sub-pixel 49g that can display the third color in the same pixel 48A is coupled to the scanning line SCL2 next to the scanning line SCL1.

As illustrated in FIGS. 3A, 3B, 3C, and 4, the scanning line SCL1 is coupled to the switching element of the sub-pixel 49g that can display the third color in a pixel 48B and to the switching element of the sub-pixel 49r that can display the second color in the next column in the pixel 48B. The switching element of the sub-pixel 49b that can display the first color in the same pixel 48B is coupled to the scanning line SCL2 next to the scanning line SCL1.

The scanning line SCL1 is coupled to the switching element of the sub-pixel 49b that can display the first color in a pixel 48C and to the switching element of the sub-pixel 49g that can display the third color in the next column in the pixel 48C. The switching element of the sub-pixel 49r that can display the second color in the same pixel 48C is coupled to the scanning line SCL2 next to the scanning line SCL1.

As illustrated in FIGS. 3A, 3B, 3C, and 4, the scanning line SCL2 is coupled to the switching element of the sub-pixel 49r that can display the second color and to the switching element of the sub-pixel 49b that can display the first color in the next column in another pixel 48A. The switching element of the sub-pixel 49g that can display the third color in the same pixel 48A is coupled to the scanning line SCL3 next to the scanning line SCL2.

As illustrated in FIGS. 3A, 3B, 3C, and 4, the scanning line SCL2 is coupled to the switching element of the sub-pixel 49g that can display the third color and to the switching element of the sub-pixel 49r that can display the second color in the next column in another pixel 48B. The switching element of the sub-pixel 49b that can display the first color in the same pixel 48B is coupled to the scanning line SCL3 next to the scanning line SCL2.

The scanning line SCL2 is coupled to the switching element of the sub-pixel 49b that can display the first color and to the switching element of the sub-pixel 49g that can display the third color in the next column in another pixel 48C. The switching element of the sub-pixel 49r that can display the second color in the same pixel 48C is coupled to the scanning line SCL3 next to the scanning line SCL2.

In other words, the scanning line SCLp (1≤p≤m) is coupled to the switching element of the second sub-pixel 32 and the switching element of the first sub-pixel 31 in the pixels 48A, 48B, and 48C. The switching element of the third sub-pixel 33 in the same pixel is coupled to the scanning line SCLp+1 (1≤p≤m) next to the scanning line SCLp. Alternatively, the switching element of the third sub-pixel 33 in the same pixel may be coupled to the scanning line SCLp by changing the arrangement of wiring.

Figure 5:
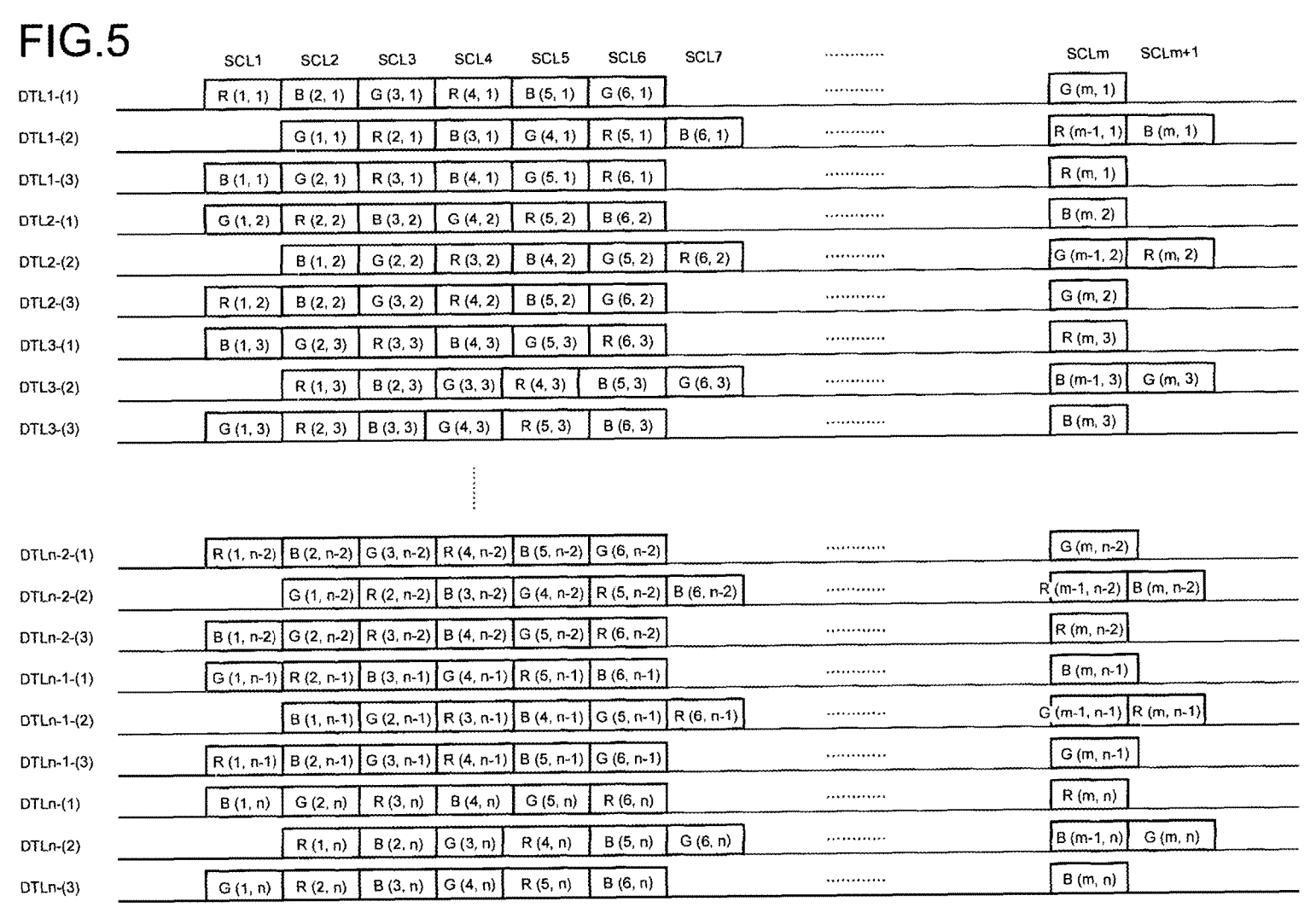

FIG. 5 is a timing chart illustrating drive of the display device according to the embodiment. As illustrated in FIG. 5, the switching element of the third sub-pixel 33 in the pixel 48A is coupled to the scanning line SCL2. The signal output circuit 41 retains display data G(1,1) corresponding to the sub-pixel 49g that can display the third color in the first pixel (1,1), with a memory capacity of a memory RC that temporarily stores therein the display data G(1,1). When the scanning circuit 42 scans the scanning line SCL2, the signal output circuit 41 needs to read the display data G(1,1) from the memory RC and transmit it to the signal line DTL1-(2).

The signal output circuit 41 also retains display data B(1,2) for the third sub-pixel 33 in the pixel 48B with a memory capacity of the memory RC that temporarily stores therein the display data B(1,2). When the scanning circuit 42 scans the scanning line SCL2, the signal output circuit 41 needs to read the display data B(1,2) from the memory RC and transmit it to the signal line DTL2-(2). The signal output circuit 41 also retains display data R(1,3) for the third sub-pixel 33 in the pixel 48C with a memory capacity of the memory RC that temporarily stores therein the display data R(1,3). When the scanning circuit 42 scans the scanning line SCL2, the signal output circuit 41 needs to read the display data R(1,3) from the memory RC and transmit it to the signal line DTL3-(2). In other words, the signal output circuit 41 processes the display data to be displayed in the third sub-pixel 33 with a delay of one scanning line.

As described above, the display device 1 according to the embodiment includes the display area 30 in which the pixels 48 are arranged in a matrix. The pixels 48 each include the first sub-pixel 31, the second sub-pixel 32, and the third sub-pixel 33. The first sub-pixel 31 has the largest area among the sub-pixels in one pixel. The second sub-pixel 32 has an area smaller than that of the first sub-pixel 31 and is adjacent to the first sub-pixel 31. The third sub-pixel 33 is adjacent to the first sub-pixel 31 and the second sub-pixel 32, has an area smaller than that of the first sub-pixel 31, and is arranged in the same column of sub-pixels as that of the second sub-pixel 32. The area of the second sub-pixel 32 may be equal to or different from that of the third sub-pixel 33.

The area ratio among the first sub-pixel 31, the second sub-pixel 32, and the third sub-pixel 33 in a pixel 48A affects the balance of the first color, the second color, and the third color displayed by the respective sub-pixels. As described above, the pixels 48A, 48B, and 48C are repeatedly arranged in this order in the X-direction in FIG. 4. Therefore, the ratio among the first, the second, and the third colors displayable by the first sub-pixel 31, the second sub-pixel 32, and the third sub-pixel 33 included in the pixels 48A, 48B, and 48C aligned successively in one direction of a single row is different from the area ratio among the first sub-pixel 31, the second sub-pixel 32, and the third sub-pixel 33 included in one pixel 48A. With this configuration, the ratio of the colors is balanced unlike the ratio among the first, the second, and the third colors displayable by one pixel 48A. Assume that the area of the entire pixel 48A is 100, the area of the first sub-pixel 31 is 50, the area of the second sub-pixel 32 is 20, and the area of the third sub-pixel 33 is 30. The area ratio among the first, the second, and the third colors is expressed by 50:20:30=5:2:3. The first sub-pixels 31, the second sub-pixels 32, and the third sub-pixels 33 are included in the three types of pixels 48A, 48B, and 48C aligned successively in one direction of a single row and serve as the sub-pixels 49r, 49g, and 49b that can each display one of the first, the second, and the third colors. The area ratio among the first, the second, and the third colors that can be displayed is expressed by (50+20+30):(30+50+20):(20+30+50)=1:1:1. Thus, the pixels include the pixel 48A serving as the first pixel, the pixel 48B serving as the second pixel, and the pixel 48C serving as the third pixel, and the areas of the first, the second, and the third colors displayable by the three types of pixels in total are equal to one another.

As described above, the first, the second, and the third colors are balanced in total in the pixels 48A, 48B, and 48C aligned successively in one direction of a single row or a single column. The area ratio among the first sub-pixel 31, the second sub-pixel 32, and the third sub-pixel 33 described above is merely an example and the embodiment is not limited thereto.

Figure 6:
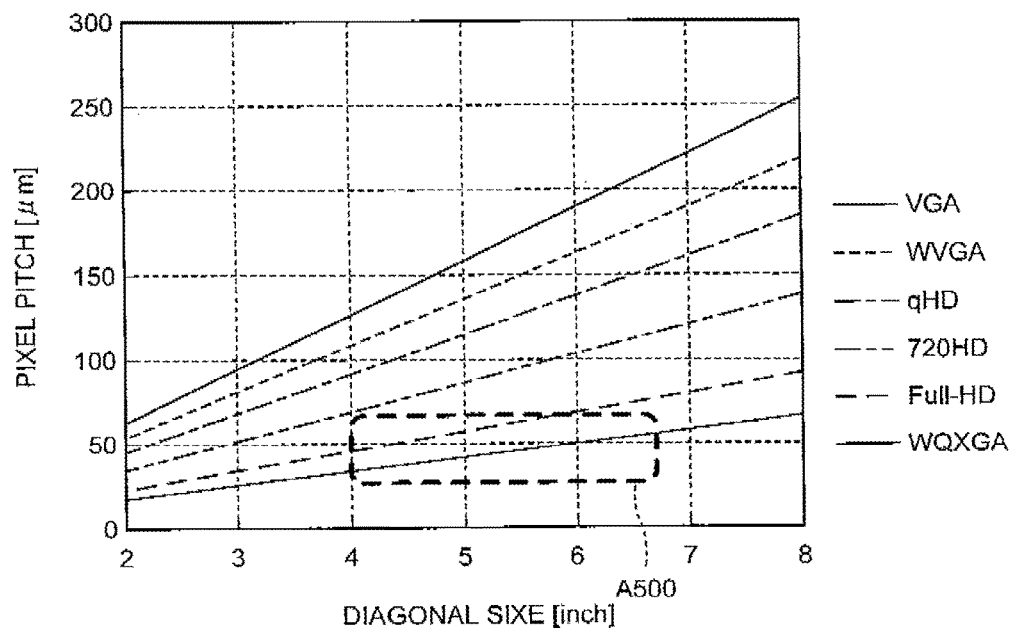
FIG. 6 is a graph illustrating the relation between resolution and the diagonal length of the sub-pixel.
Figure 7:
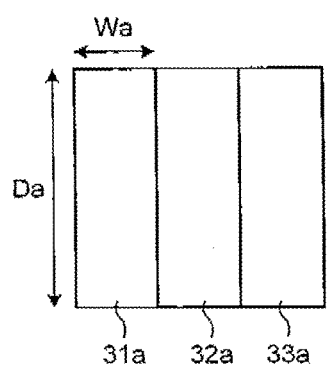
FIG. 7 is a diagram illustrating the size of a pixel according to a comparative example.

FIG. 6 is a graph illustrating the relation between resolution and the diagonal length of the sub-pixel. The ordinate indicates the resolution, whereas the abscissa indicates the diagonal length of the sub-pixel. A region of 500 ppi (pixels per inch) is represented by A500. FIG. 7 is a diagram illustrating the size of a pixel according to a comparative example. In FIG. 6, VGA denotes the resolution provided in a case where 640×480 pixels are arranged in a matrix. WVGA denotes the resolution provided in a case where 800×480 pixels are arranged in a matrix. qHD (quarter HD) denotes the resolution provided in a case where 960×540 pixels are arranged in a matrix. 720 HD denotes the resolution provided in a case where 1280×720 pixels are arranged in a matrix. Full-HD denotes the resolution provided in a case where 1920×1080 pixels are arranged in a matrix. WQ×GA denotes the resolution provided in a case where 2560×1600 pixels are arranged in a matrix.

Figure 8:
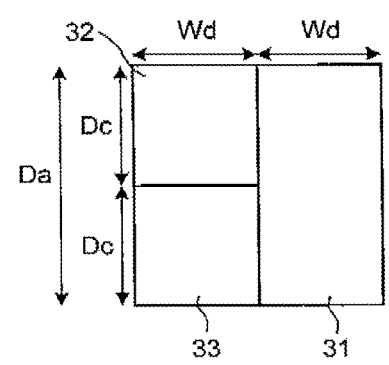
FIG. 8 is a diagram illustrating the size of the pixel according to the embodiment.

FIG. 8 is a diagram illustrating the size of a pixel according to the embodiment. In the pixel illustrated in FIG. 7, a first sub-pixel 31a, a second sub-pixel 32a, and a third sub-pixel 33a having the same shape are arranged in three columns. In the arrangement of sub-pixels in the pixel according to the comparative example, an increase in the pixel density may possibly reduce the aperture ratio.

In the pixel according to the embodiment, as illustrated in FIG. 8, the aperture area in the first sub-pixel 31 is Da×Wd, the aperture area in the second sub-pixel 32 is Dc×Wd, and the aperture area in the third sub-pixel 33 is Dc×Wd. Assume a case where the pixel according to the embodiment is compared with the pixel according to the comparative example in the region of 500 ppi illustrated in FIG. 6. If the area of the entire pixel illustrated in FIG. 7 is equal to that of the entire pixel illustrated in FIG. 8, Wd is 3/2 times as large as Wa. Thus, the display area 30 according to the embodiment in FIG. 1 can maintain a higher aperture ratio than the pixel according to the comparative example in FIG. 7, even with high pixel density.

In the display device 1 according to the embodiment, as illustrated in FIGS. 3A, 3B, 3C, and 4, the first sub-pixels 31, the second sub-pixels 32, or the third sub-pixels 33 arranged in every other column of sub-pixels in a single row of pixels can display different colors between the columns. Thus, the display device 1 according to the embodiment can balance the colors in the X-direction.

In the display device 1 according to the embodiment, as illustrated in FIGS. 3A, 3B, 3C, and 4, the second sub-pixels 32 or the third sub-pixels 33 arranged in every other row of sub-pixels in a single column of pixels can display different colors between the rows. Thus, the display device 1 according to the embodiment can balance the colors in the Y-direction.

In the display device 1 according to the embodiment, as illustrated in FIGS. 3A, 3B, 3C, and 4, the first sub-pixels 31 arranged in pixels adjacent to each other in a single column of pixels can display different colors. Thus, the display device 1 according to the embodiment can balance the colors in the Y-direction.

As described above, the display device 1 according to the embodiment can balance the colors even if the sub-pixels have different shapes to increase the pixel density.

First Modification

Figure 9A:
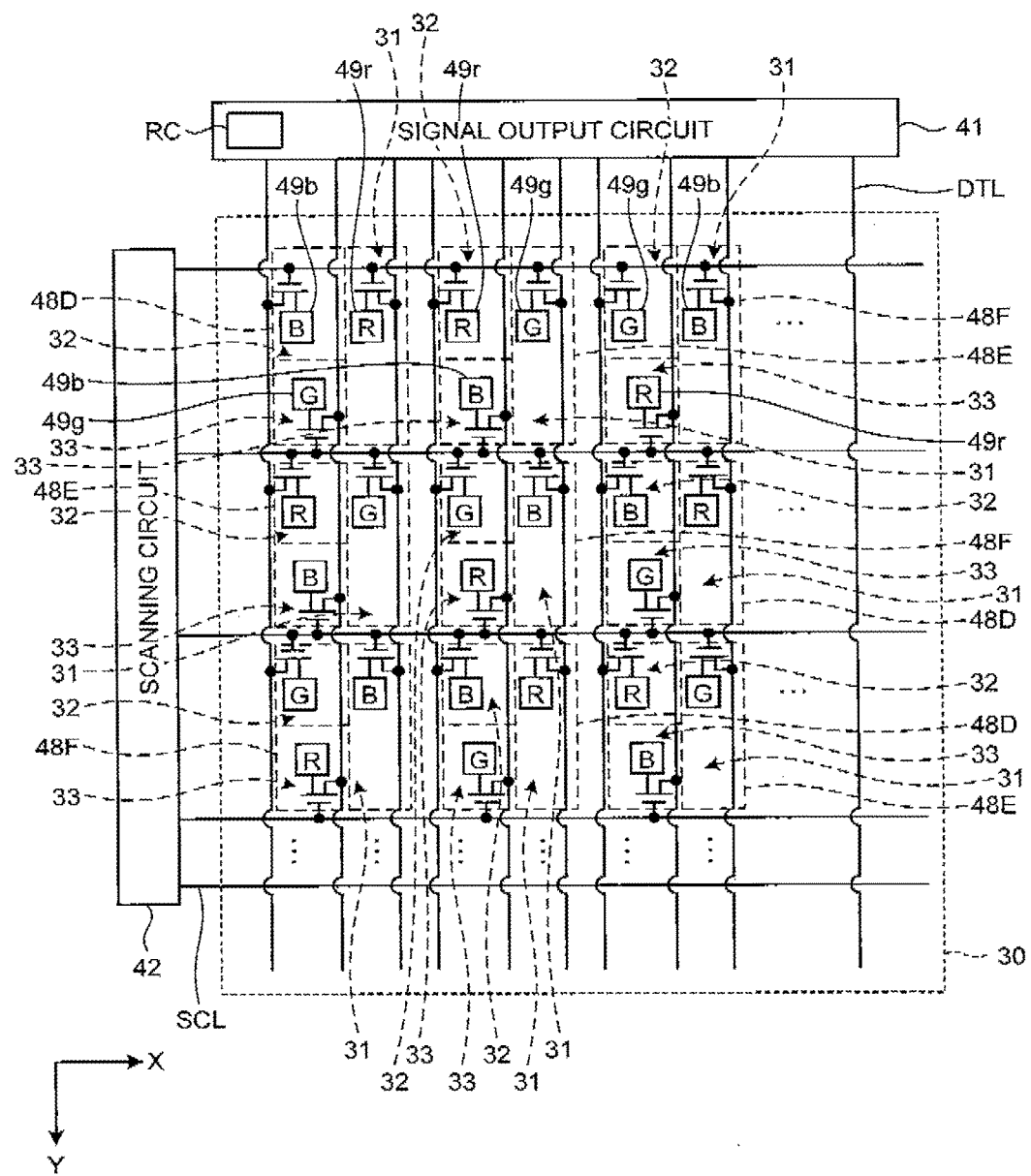
FIG. 9A is a conceptual diagram of the display unit and the drive circuit of the display unit according to a first modification of the embodiment.
Figure 9B:
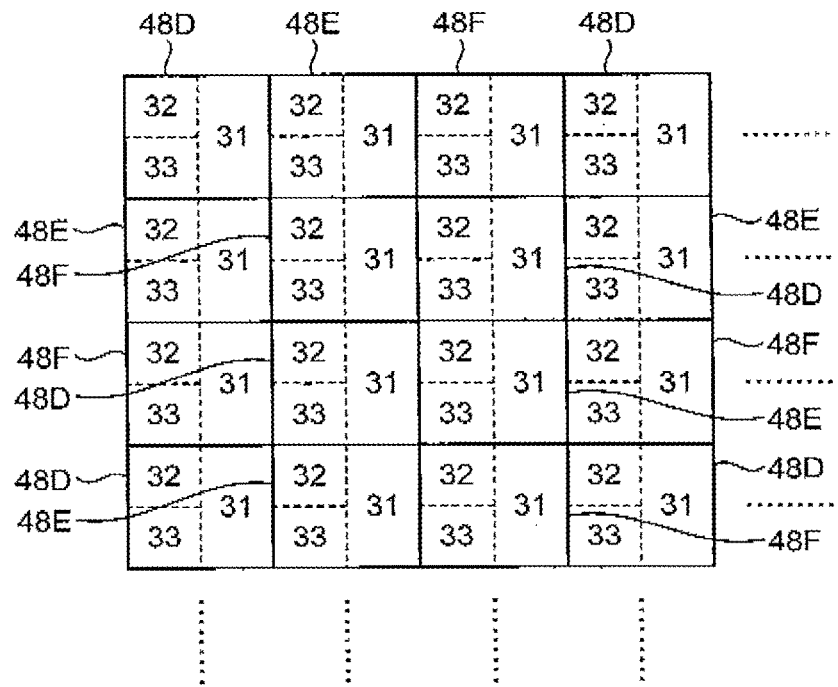
FIG. 9B is a diagram schematically illustrating sub-pixels in the display unit illustrated in FIG. 9A.
Figure 9C:
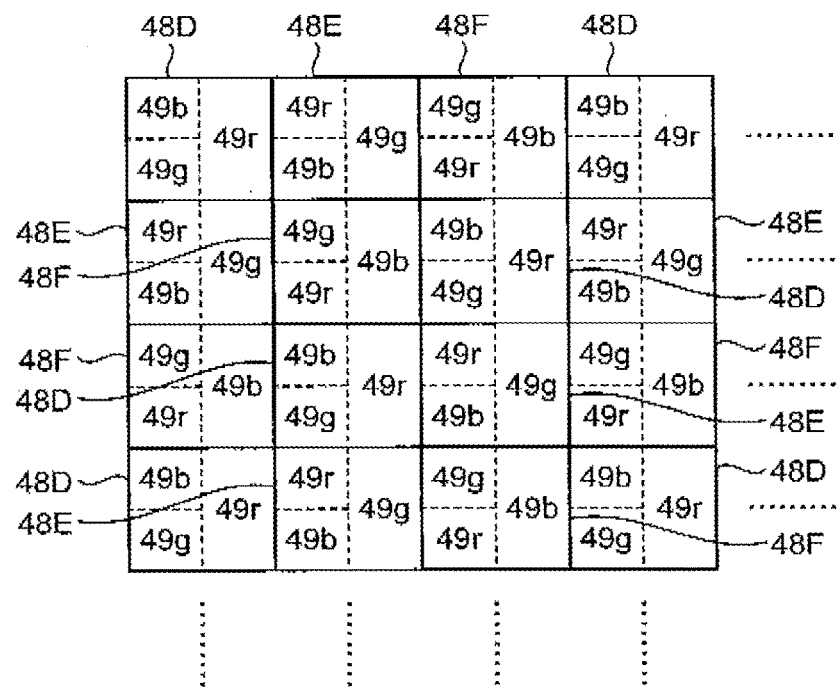
FIG. 9C is a diagram illustrating colors displayable by the respective sub-pixels in the display unit illustrated in FIG. 9B.
Figure 10:
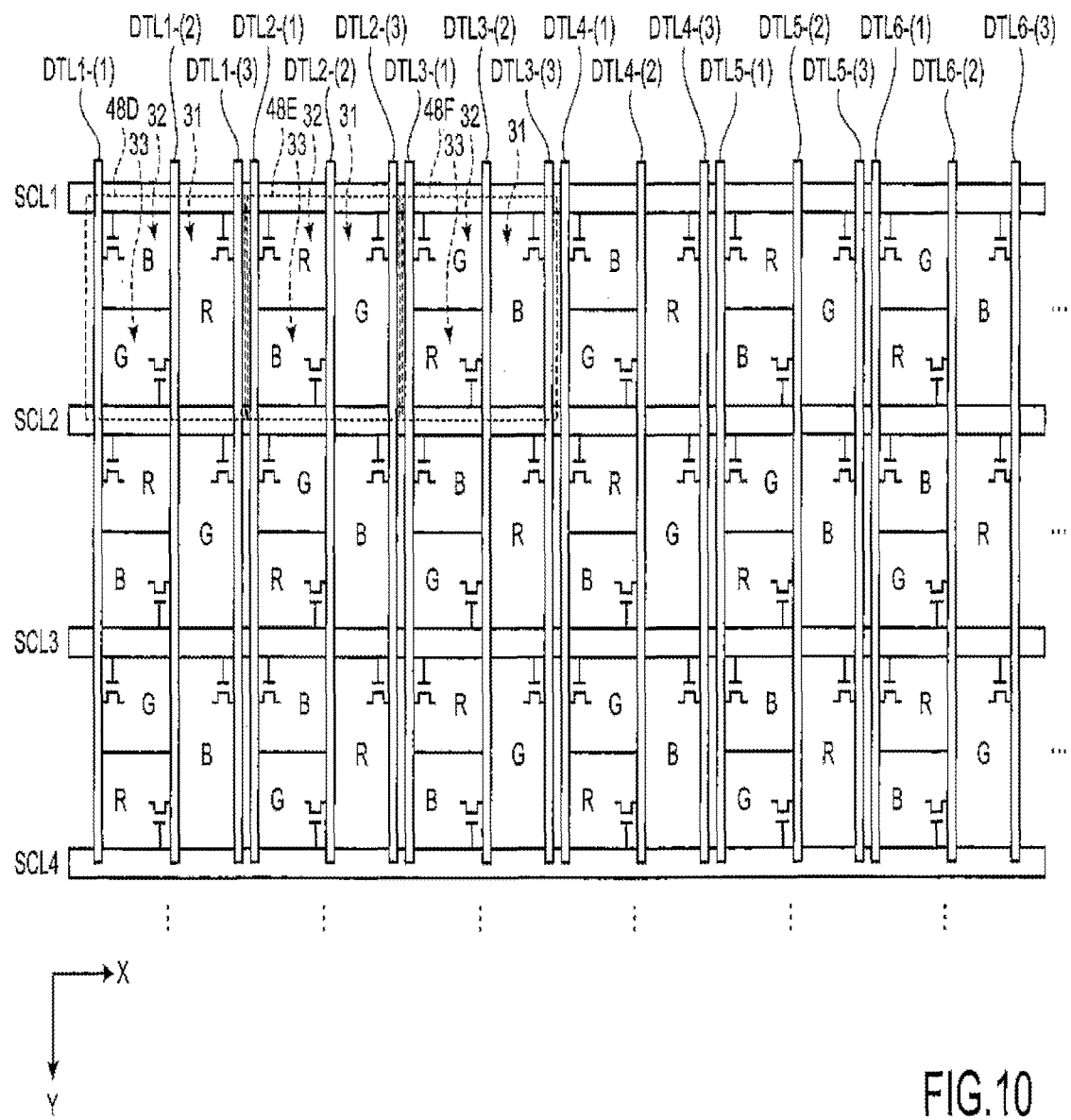
FIG. 10 is a diagram illustrating an array of pixels in the display unit according to the first modification of the embodiment.

FIG. 9A is a conceptual diagram of the display unit and the drive circuit of the display unit according to a first modification of the embodiment. FIG. 9B is a diagram schematically illustrating sub-pixels in the display unit illustrated in FIG. 9A. FIG. 9C is a diagram illustrating colors displayable by the respective sub-pixels in the display unit illustrated in FIG. 9B. FIG. 10 is a diagram illustrating an array of pixels in the display unit according to the first modification of the embodiment. Components identical to those described above are denoted by the same reference numerals, and detailed description thereof will be omitted.

As illustrated in FIGS. 9A, 9B, and 10, a pixel 48D, a pixel 48E, and a pixel 48F each include the first sub-pixel 31, the second sub-pixel 32, and the third sub-pixel 33. The first sub-pixel 31 has the largest area among the first sub-pixel 31, the second sub-pixel 32, and the third sub-pixel 33. The second sub-pixel 32 has an area smaller than that of the first sub-pixel 31 and is adjacent to the first sub-pixel 31. The third sub-pixel 33 is adjacent to the first sub-pixel 31 and the second sub-pixel 32 and has an area smaller than that of the first sub-pixel 31. The third sub-pixel 33 has an area constituting a polygonal pixel in combination with the areas of the first sub-pixel 31 and the second sub-pixel 32.

In the pixel 48D, as illustrated in FIGS. 9A, 9B, 9C, and 10, the first sub-pixel 31 corresponds to the sub-pixel 49r that can display the second color, the second sub-pixel 32 corresponds to the sub-pixel 49b that can display the first color, and the third sub-pixel 33 corresponds to the sub-pixel 49g that can display the third color. In the pixel 48E, the first sub-pixel 31 corresponds to the sub-pixel 49g that can display the third color, the second sub-pixel 32 corresponds to the sub-pixel 49r that can display the second color, and the third sub-pixel 33 corresponds to the sub-pixel 49b that can display the first color. In the pixel 48F, the first sub-pixel 31 corresponds to the sub-pixel 49b that can display the first color, the second sub-pixel 32 corresponds to the sub-pixel 49g that can display the third color, and the third sub-pixel 33 corresponds to the sub-pixel 49r that can display the second color.

The pixels 48D, 48E, and 48F are repeatedly arranged in this order in the X-direction in FIG. 10. The sub-pixel 49r that can display the second color is arranged on the first sub-pixel 31 in the pixel 48D, the second sub-pixel 32 in the pixel 48E, and the third sub-pixel 33 in the pixel 48F in a manner of shifting its position in the counterclockwise direction in the order of the pixels 48D, 48E, and 48F. The sub-pixel 49g that can display the third color is arranged on the third sub-pixel 33 in the pixel 48D, the first sub-pixel 31 in the pixel 48E, and the second sub-pixel 32 in the pixel 48F in a manner of shifting its position in the counterclockwise direction in the order of the pixels 48D, 48E, and 48F. The sub-pixel 49b that can display the first color is arranged on the second sub-pixel 32 in the pixel 48D, the third sub-pixel 33 in the pixel 48E, and the first sub-pixel 31 in the pixel 48F in a manner of shifting its position in the counterclockwise direction in the order of the pixels 48D, 48E, and 48F.

As a result, the pixel 48D is adjacent only to the pixel 48E and the pixel 48F in the X-direction and the Y-direction. The pixel 48E is adjacent only to the pixel 48D and the pixel 48F in the X-direction and the Y-direction. The pixel 48F is adjacent only to the pixel 48D and the pixel 48E in the X-direction and the Y-direction.

The pixels 48D, 48E, and 48F are each aligned in a diagonal direction toward lower left in FIG. 10. For example, the first sub-pixel 31 of a certain pixel 48D can display the second color, the second sub-pixel 32 thereof can display the first color, and the third sub-pixel 33 thereof can display the third color. In this case, a pixel adjacent to the certain pixel in the diagonal direction toward lower left is also a pixel 48D. Thus, the first sub-pixel 31 in this adjacent pixel can display the second color, the second sub-pixel 32 can display the first color, and the third sub-pixel 33 can display the third color.

Similarly to the display area 30 according to the embodiment, the display device 1 according to the first modification of the embodiment can maintain the aperture ratio even with high pixel density.

In the display device 1 according to the first modification of the embodiment, as illustrated in FIGS. 9A, 9B, 9C, and 10, the first sub-pixels 31, the second sub-pixels 32, or the third sub-pixels 33 arranged in every other column of sub-pixels in a single row of pixels can display different colors between the columns. Thus, the display device 1 according to the embodiment can balance the colors in the X-direction.

In the display device 1 according to the first modification of the embodiment, as illustrated in FIGS. 9A, 9B, 9C, and 10, the second sub-pixels 32 or the third sub-pixels 33 arranged in every other row of sub-pixels in a single column of pixels can display different colors between the rows. Thus, the display device 1 according to the embodiment can balance the colors in the Y-direction.

In the display device 1 according to the first modification of the embodiment, as illustrated in FIGS. 9A, 9B, 9C, and 10, the first sub-pixels 31 arranged in pixels adjacent to each other in a single column of pixels can display different colors. Thus, the display device 1 according to the embodiment can balance the colors in the Y-direction.

As described above, the display device 1 according to the first modification of the embodiment can balance the colors even if the sub-pixels have different shapes to increase the pixel density.

Second Modification

Figure 11A:
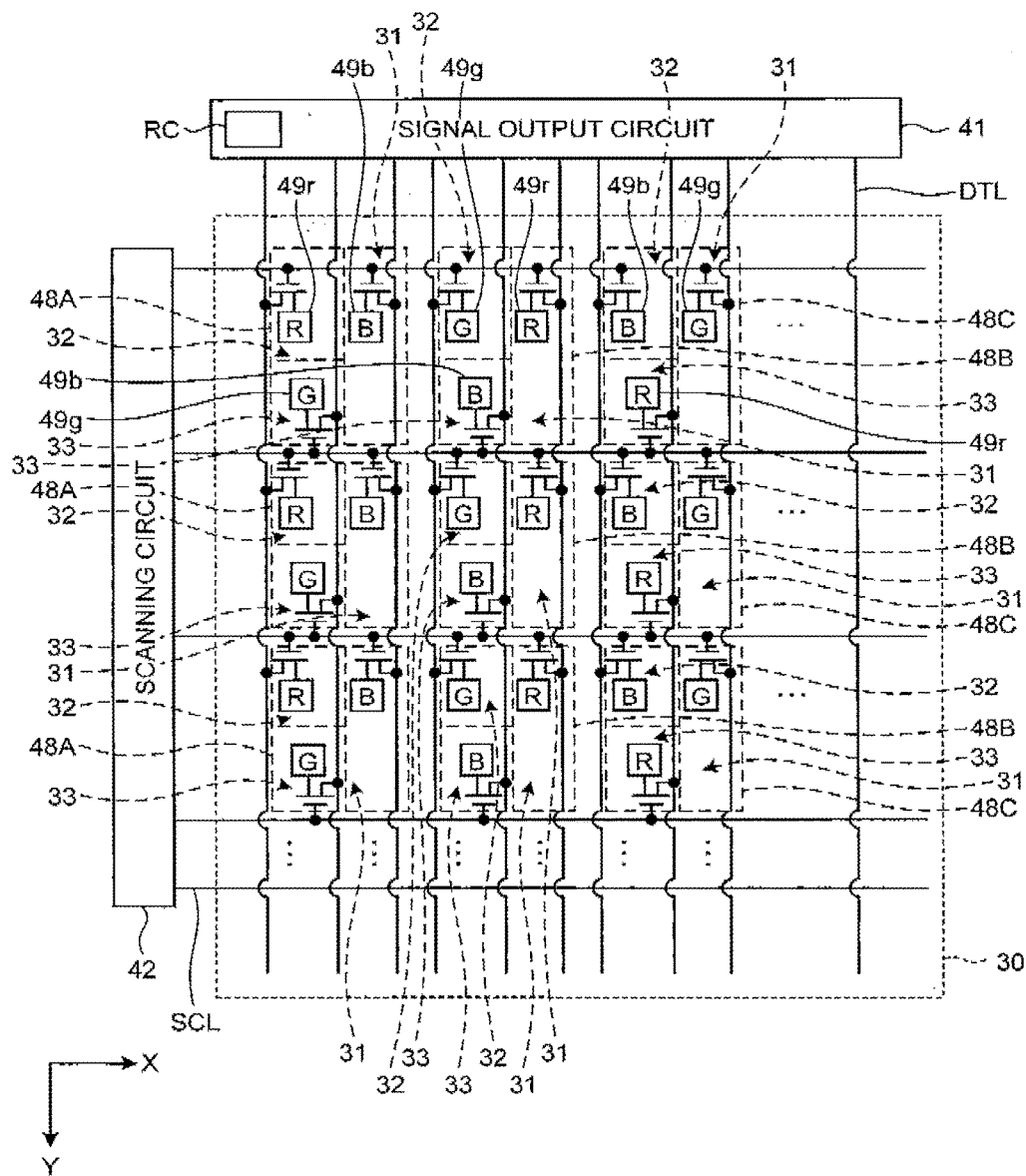
FIG. 11A is a conceptual diagram of the display unit and the drive circuit of the display unit according to a second modification of the embodiment.
Figure 11B:
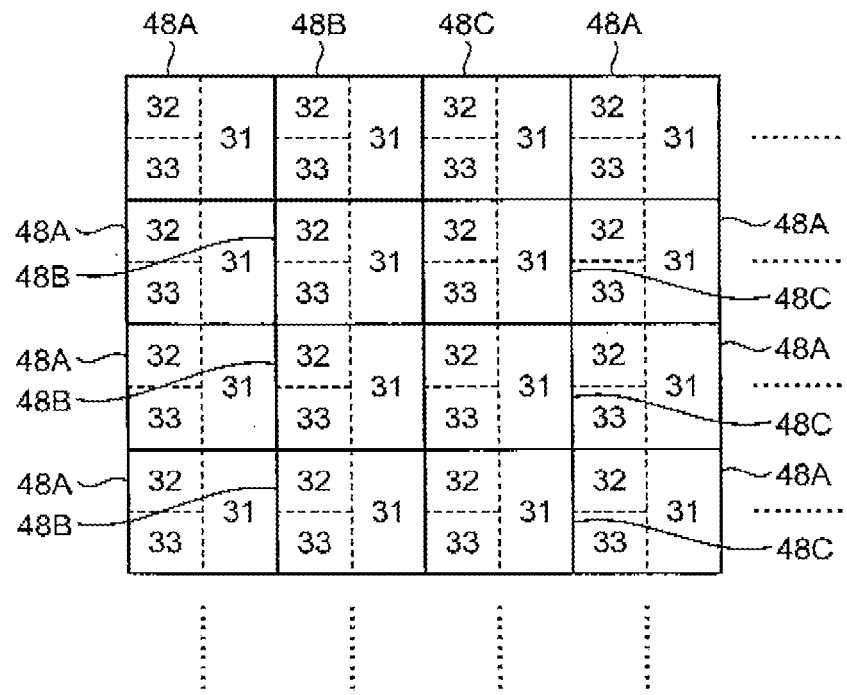
FIG. 11B is a diagram schematically illustrating sub-pixels in the display unit illustrated in FIG. 11A.
Figure 11C:
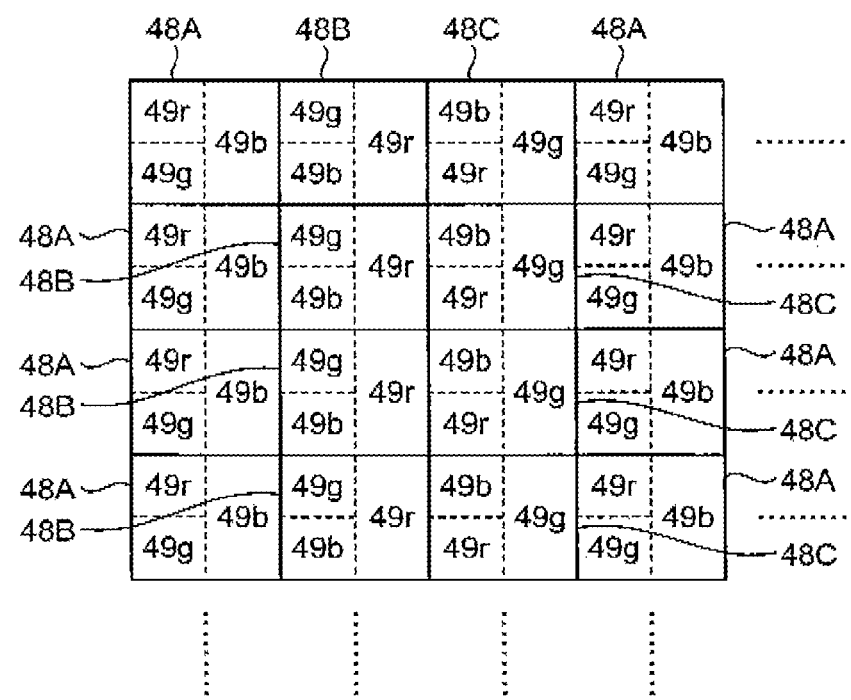
FIG. 11C is a diagram illustrating colors displayable by the respective sub-pixels in the display unit illustrated in FIG. 11B.
Figure 12:
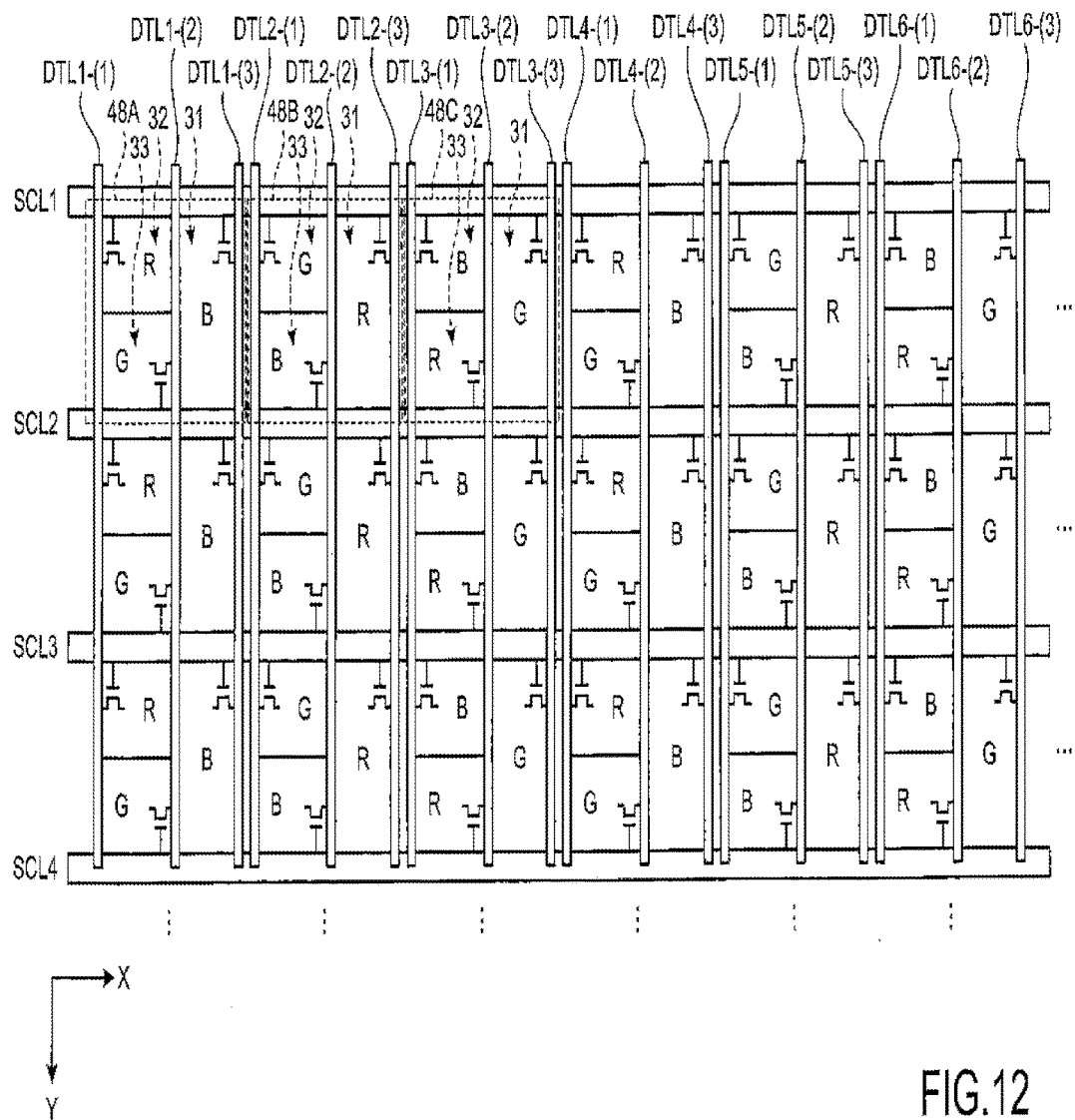
FIG. 12 is a diagram illustrating an array of pixels in the display unit according to the second modification of the embodiment.

FIG. 11A is a conceptual diagram of the display unit and the drive circuit of the display unit according to a second modification of the embodiment. FIG. 11B is a diagram schematically illustrating sub-pixels in the display unit illustrated in FIG. 11A. FIG. 11C is a diagram illustrating colors displayable by the respective sub-pixels in the display unit illustrated in FIG. 11B. FIG. 12 is a diagram illustrating an array of pixels in the display unit according to the second modification of the embodiment. Components identical to those described above are denoted by the same reference numerals, and detailed description thereof will be omitted.

The pixels 48A, 48B, and 48C are repeatedly arranged in this order in the X-direction in FIG. 11A. The sub-pixel 49r that can display the second color is arranged on the second sub-pixel 32 in the pixel 48A, the first sub-pixel 31 in the pixel 48B, and the third sub-pixel 33 in the pixel 48C in a manner of shifting its position in the clockwise direction in the order of the pixels 48A, 48B, and 48C. The sub-pixel 49g that can display the third color is arranged on the third sub-pixel 33 in the pixel 48A, the second sub-pixel 32 in the pixel 48B, and the first sub-pixel 31 in the pixel 48C in a manner of shifting its position in a clockwise direction in the order of the pixels 48A, 48B, and 48C. The sub-pixel 49b that can display the first color is arranged on the first sub-pixel 31 in the pixel 48A, the third sub-pixel 33 in the pixel 48B, and the first sub-pixel 31 in the pixel 48C in a manner of shifting its position in the clockwise direction in the order of the pixels 48A, 48B, and 48C.

In the display device 1 according to the second modification of the embodiment, any one of the pixels 48A, the pixels 48B, or the pixels 48C are arranged in a single column in the Y-direction illustrated in FIG. 12.

As a result, the pixel 48A is adjacent only to the pixel 48B and the pixel 48C in the X-direction and only to the pixel 48A in the Y-direction.

The pixel 48B is adjacent only to the pixel 48A and the pixel 48C in the X-direction and only to the pixel 48B in the Y-direction.

The pixel 48C is adjacent only to the pixel 48A and the pixel 48B in the X-direction and only to the pixel 48C in the Y-direction.

Similarly to the display area 30 according to the embodiment, the display device 1 according to the second modification of the embodiment can maintain the aperture ratio even with high pixel density.

In the display device 1 according to the second modification of the embodiment, as illustrated in FIGS. 11A, 11B, 11C, and 12, the first sub-pixels 31, the second sub-pixels 32, or the third sub-pixels 33 arranged in every other column of sub-pixels in a single row of pixels can display different colors between the columns. Thus, the display device 1 according to the second modification of the embodiment can balance the colors in the X-direction.

In comparison between the display device 1 illustrated in FIG. 4 or 10 and the display device 1 according to the second modification of the embodiment illustrated in FIG. 12, the display device 1 in FIG. 4 or 10 can balance the colors in the Y-direction better as compared with the display device 1 according to the second modification of the embodiment.

As described above, the display device 1 according to the second modification of the embodiment can balance the colors even if the sub-pixels have different shapes to increase the pixel density.

Third Modification

Figure 13:
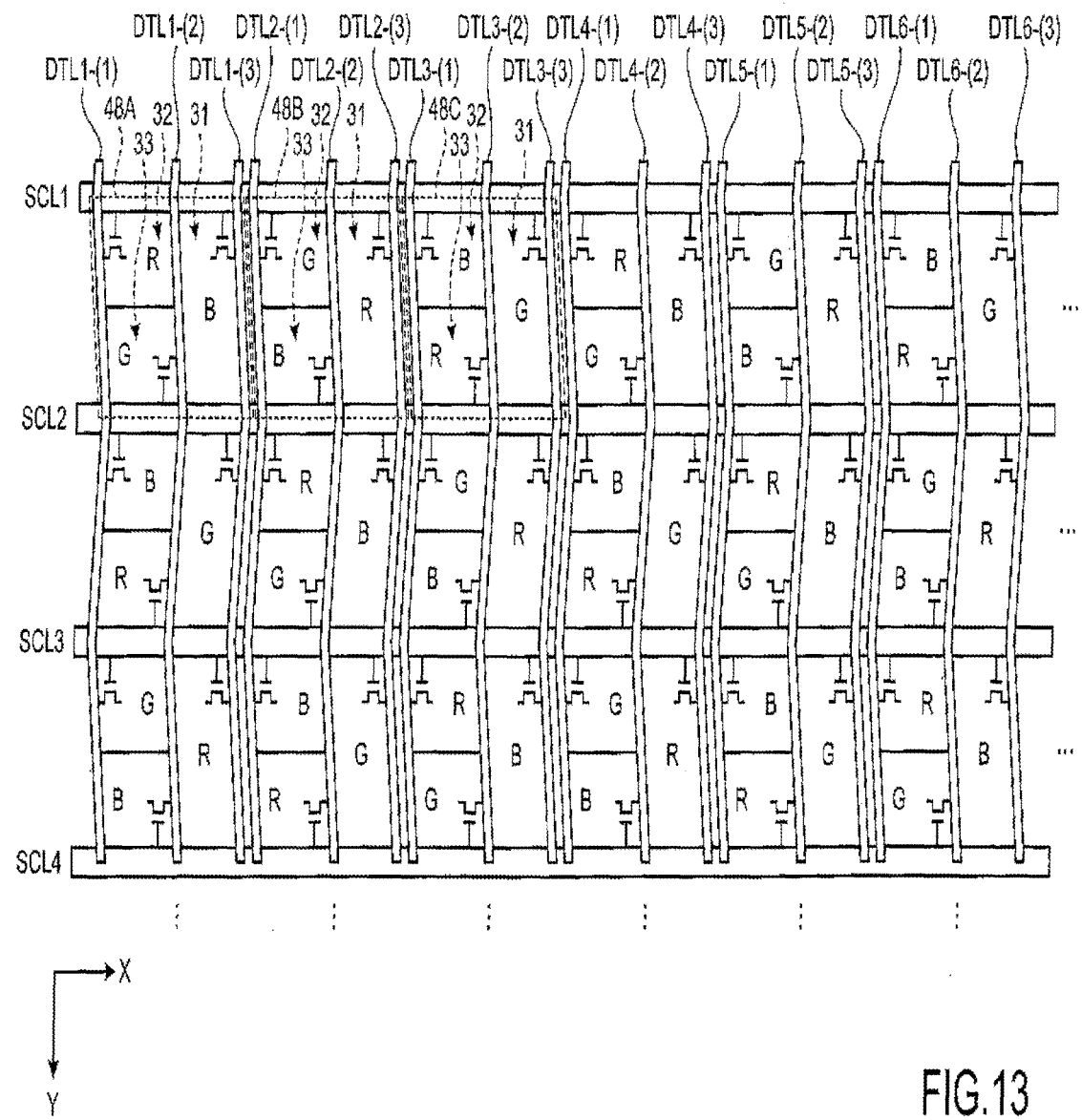
FIG. 13 is a diagram illustrating an array of pixels in the display unit according to a third modification of the embodiment.

FIG. 13 is a diagram illustrating an array of pixels in the display unit according to a third modification of the embodiment.

Components identical to those described above are denoted by the same reference numerals, and detailed description thereof will be omitted.

In the display device 1 according to the third modification of the embodiment, as illustrated in FIG. 13, the pixels 48A, 48B, and 48C each include the first sub-pixel 31, the second sub-pixel 32, and the third sub-pixel 33. The first sub-pixel 31 has the largest area among the first sub-pixel 31, the second sub-pixel 32, and the third sub-pixel 33. The second sub-pixel 32 has an area smaller than that of the first sub-pixel 31 and is adjacent to the first sub-pixel 31. The third sub-pixel 33 is adjacent to the first sub-pixel 31 and the second sub-pixel 32 and has an area smaller than that of the first sub-pixel 31. The first sub-pixel 31, the second sub-pixel 32, and the third sub-pixel 33 extend along bent signal lines as illustrated in FIG. 13, and thus a pixel composed of the first sub-pixel 31, the second sub-pixel 32, and the third sub-pixel 33 has a parallelogrammic outer shape.

Also in the case where the shape of the pixel is a parallelogram, in comparison between the pixels 48A and 48B adjacent in the X-direction or the Y-direction, the first sub-pixels 31, the second sub-pixels 32, or the third sub-pixels 33 can display different colors between the pixels. In comparison between the pixels 48B and 48C adjacent in the X-direction or the Y-direction, the first sub-pixels 31, the second sub-pixels 32, or the third sub-pixels 33 can display different colors between the pixels. In comparison between the pixels 48C and 48A adjacent in the X-direction or the Y-direction, the first sub-pixels 31, the second sub-pixels 32, or the third sub-pixels 33 can display different colors between the pixels. This configuration enables the first sub-pixels 31, the second sub-pixels 32, and the third sub-pixels 33 to display the same number of R, G, and B colors in the pixels 48A, 48B, and 48C aligned successively in at least one of the column direction or the row direction. As a result, the areas of the respective sub-pixels that display R, G, and B colors are equal in the pixels 48A, 48B, and 48C aligned successively in at least one of the column direction or the row direction.

Similarly to the display device 1 according to the third modification of the embodiment, the shape of the pixel may be a parallelogram in the display device 1 according to the first and the second modifications of the embodiment.

APPLICATION EXAMPLES

Figure 14:
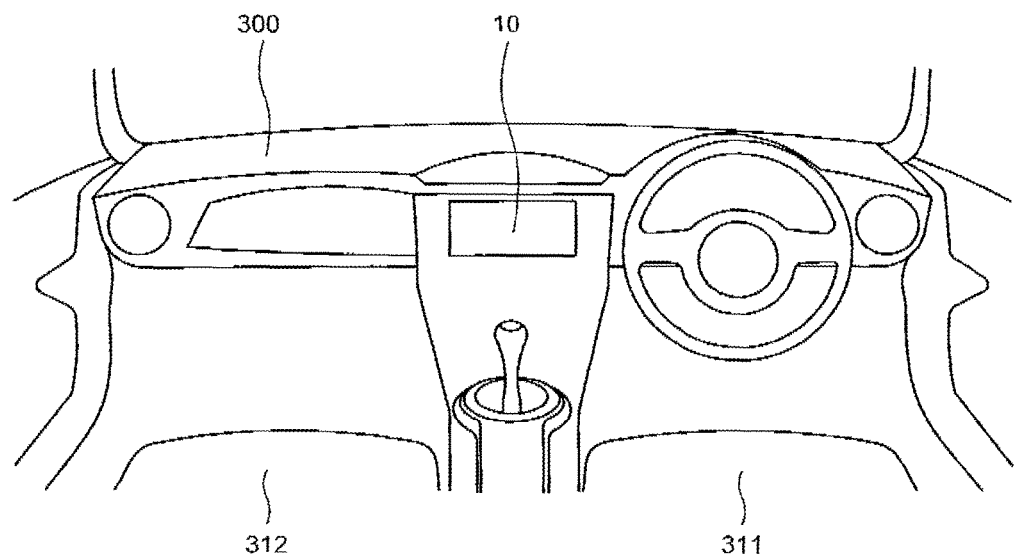
FIG. 14 is a diagram illustrating an example of an electronic apparatus including the display device according to the embodiment.
Figure 15:
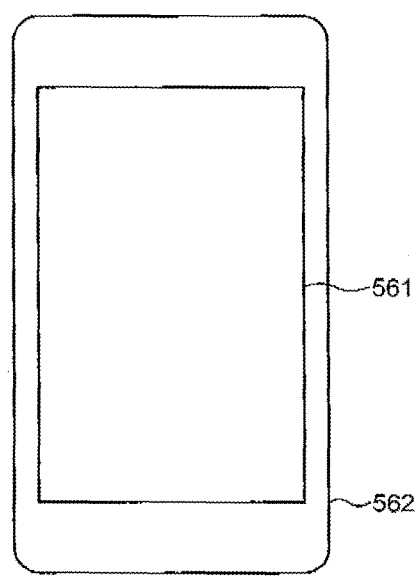
FIG. 15 is a diagram illustrating an example of an electronic apparatus including the display device according to the embodiment.

The following describes application examples of the display device 1 according to the embodiment and the modifications with reference to FIGS. 14 and 15. FIGS. 14 and 15 are diagrams each illustrating an example of an electronic apparatus including the display device according to the embodiment. The display device 1 according to the embodiment is applicable to electronic apparatuses of various fields, such as a car navigation system illustrated in FIG. 14, a television apparatus, a digital camera, a notebook personal computer, a portable electronic apparatus such as a mobile phone illustrated in FIG. 15, and a video camera. In other words, the display device 1 according to the embodiment is applicable to electronic apparatuses of various fields that display video signals received from the outside or video signals generated inside thereof as an image or video. The electronic apparatus includes the control device 11 (refer to FIG. 2) that supplies video signals to the display device and controls the operation of the display device.

The electronic apparatus illustrated in FIG. 14 is a car navigation apparatus 10 to which the display device 1 according to the embodiment and the modifications is applied. The display device 1 is arranged on a dashboard 300 in an automobile. More specifically, the display device 1 is arranged on a part of the dashboard 300 between a driver's seat 311 and a passenger seat 312. The display device 1 of the car navigation apparatus 10 is used to display navigation information, and an operating screen for music or a movie, for example.

An electronic apparatus illustrated in FIG. 15 is a portable information terminal to which the display device 1 according to the embodiment and the modifications is applied. The electronic apparatus operates as a mobile computer, a multifunctional mobile phone, a mobile computer capable of making a voice call, or a mobile computer capable of performing communications, and may be called a smartphone or a tablet terminal. The portable information terminal includes a display unit 561 on a surface of a housing 562, for example. The display unit 561 has the function of the display device 1 according to the embodiment and the modifications and a function of touch detection (i.e., a touch panel) that can detect an external proximity object.

The contents described above are not intended to limit the embodiment. The components according to the embodiment include a component easily conceivable by those skilled in the art, a component substantially identical thereto, and a component within a range of equivalents. The components can be variously omitted, replaced, and modified without departing from the gist of the embodiment described above.

The contents described above are not intended to limit the present disclosure. The components according to the present disclosure include a component easily conceivable by those skilled in the art, a component substantially identical thereto, and a component within a range of equivalents. The components described above may be appropriately combined. The components can be variously omitted, replaced, and modified without departing from the gist of the present disclosure.

Aspects of Present Disclosure

The present disclosure includes the following aspects.

(1) A display device comprising:
a display unit in which a plurality of pixels are arranged in a matrix,
wherein the pixels each include:
a first sub-pixel having a largest area among sub-pixels;
a second sub-pixel adjacent to the first sub-pixel and having an area smaller than the area of the first sub-pixel; and
a third sub-pixel adjacent to the first sub-pixel and the second sub-pixel, having an area smaller than the area of the first sub-pixel, and arranged in a same column of sub-pixels as a column of second sub-pixels,
wherein a first pixel, a second pixel, and a third pixel among the pixels are aligned in at least one of a column direction or a row direction and each include the first sub-pixel, the second sub-pixel, and the third sub-pixel that are capable of displaying different one of a first color, a second color, and a third color, and
wherein areas of the first color, the second color, and the third color displayable by the first pixel, the second pixel, and the third pixel in total are equal to one another.

(2) The display device according to (1), wherein colors displayable by first sub-pixels included in two adjacent pixels among the first pixel, the second pixel, and the third pixel are different from each other.

(3) The display device according to (2), wherein colors displayable by second sub-pixels included in two adjacent pixels among the first pixel, the second pixel, and the third pixel are different from each other.

(4) The display device according to (3), wherein colors displayable by third sub-pixels included in two adjacent pixels among the first pixel, the second pixel, and the third pixel are different from each other.

(5) The display device according to (1), (2), (3) or (4), wherein
when the first sub-pixel included in the first pixel is capable of displaying the first color, the second sub-pixel included in the first pixel is capable of displaying the second color, and the third sub-pixel included in the first pixel is capable of displaying the third color,
the first sub-pixel included in the second pixel is capable of displaying the second color, the second sub-pixel included in the second pixel is capable of displaying the third color, and the third sub-pixel included in the second pixel is capable of displaying the first color, and
the first sub-pixel included in the third pixel is capable of displaying the third color, the second sub-pixel included in the third pixel is capable of displaying the first color, and the third sub-pixel included in the third pixel is capable of displaying the second color.

(6) The display device according to (1), (2), (3) or (4), wherein
when the first sub-pixel included in the first pixel is capable of displaying the first color, the second sub-pixel included in the first pixel is capable of displaying the second color, and the third sub-pixel included in the first pixel is capable of displaying the third color,
the first sub-pixel included in the second pixel is capable of displaying the third color, the second sub-pixel included in the second pixel is capable of displaying the first color, and the third sub-pixel included in the second pixel is capable of displaying the second color, and the first sub-pixel included in the third pixel is capable of displaying the second color, the second sub-pixel included in the third pixel is capable of displaying the third color, and the third sub-pixel included in the third pixel is capable of displaying the first color.

(7) The display device according to (1), (2), (3), (4), (5) or (6), wherein when the first sub-pixel included in the first pixel is capable of displaying the first color, the second sub-pixel included in the first pixel is capable of displaying the second color, and the third sub-pixel included in the first pixel is capable of displaying the third color, the first sub-pixel included in a pixel adjacent to the first pixel in a diagonal direction is capable of displaying the first color, the second sub-pixel included in the pixel is capable of displaying the second color, and the third sub-pixel included in the pixel is capable of displaying the third color.

What is claimed is:

1. A display device comprising:
    a display unit having a plurality of pixels arranged in a matrix, wherein the pixels each include:
        a first sub-pixel;
        a second sub-pixel adjacent to the first sub-pixel and having an area smaller than an area of the first sub-pixel; and
        a third sub-pixel adjacent to the first sub-pixel and the second sub-pixel, and having an area smaller than the area of the first sub-pixel, the second sub-pixel and the third sub-pixel being arranged along a column direction,
    the plurality of pixels comprises a first pixel, a second pixel, and a third pixel aligned in at least one of the column direction or a row direction,
    the first sub-pixel, second sub-pixel, and third sub-pixel of the first pixel are configured to display different ones of a first color, a second color, and a third color,
    the first sub-pixel, second sub-pixel, and third sub-pixel of the second pixel are configured to display different ones of the first color, the second color, and the third color,
    the first sub-pixel, second sub-pixel, and third sub-pixel of the third pixel are configured to display different ones of the first color, the second color, and the third color, and
    a sub-pixel, which is the first sub-pixel included in one of the first pixel, the second pixel, and the third pixel, and another sub-pixel, which is the second sub-pixel or the third sub-pixel that is adjacent to the first sub-pixel included in the one of the first pixel, the second pixel, and the third pixel and that is included in a pixel adjacent to the one of the first pixel, the second pixel, and the third pixel in the row direction, are configured to display the same one of the first color, the second color, and the third color.

2. The display device according to claim 1, wherein a color displayable by the first sub-pixel included in the one of the first pixel, the second pixel, and the third pixel is different from a color displayable by the first sub-pixel included in a pixel adjacent to the one of the first pixel, the second pixel, and the third pixel in the column direction or the row direction.

3. The display device according to claim 2, wherein a color displayable by the second sub-pixel included in the one of the first pixel, the second pixel, and the third pixel is different from a color displayable by the second sub-pixel included in the pixel adjacent to the one of the first pixel, the second pixel, and the third pixel in the column direction or the row direction.

4. The display device according to claim 3, wherein a color displayable by the third sub-pixel included in the one of the first pixel, the second pixel, and the third pixel is different from a color displayable by the third sub-pixel included in the pixel adjacent to the one of the first pixel, the second pixel, and the third pixel in the column direction or the row direction.

5. The display device according to claim 1, wherein
when the first sub-pixel included in the first pixel is capable of displaying the first color, the second sub-pixel included in the first pixel is capable of displaying the second color, and the third sub-pixel included in the first pixel is capable of displaying the third color,
the first sub-pixel included in the second pixel is capable of displaying the second color, the second sub-pixel included in the second pixel is capable of displaying the third color, and the third sub-pixel included in the second pixel is capable of displaying the first color, and
the first sub-pixel included in the third pixel is capable of displaying the third color, the second sub-pixel included in the third pixel is capable of displaying the first color, and the third sub-pixel included in the third pixel is capable of displaying the second color.

6. The display device according to claim 1, wherein
when the first sub-pixel included in the first pixel is capable of displaying the first color, the second sub-pixel included in the first pixel is capable of displaying the second color, and the third sub-pixel included in the first pixel is capable of displaying the third color,
the first sub-pixel included in the second pixel is capable of displaying the third color, the second sub-pixel included in the second pixel is capable of displaying the first color, and the third sub-pixel included in the second pixel is capable of displaying the second color, and
the first sub-pixel included in the third pixel is capable of displaying the second color, the second sub-pixel included in the third pixel is capable of displaying the third color, and the third sub-pixel included in the third pixel is capable of displaying the first color.

7. The display device according to claim 1, wherein
when the first sub-pixel included in the first pixel is capable of displaying the first color, the second sub-pixel included in the first pixel is capable of displaying the second color, and the third sub-pixel included in the first pixel is capable of displaying the third color,
the first sub-pixel included in a pixel adjacent to the first pixel in a diagonal direction is capable of displaying the first color, the second sub-pixel included in the pixel is capable of displaying the second color, and the third sub-pixel included in the pixel is capable of displaying the third color.

8. The display device according to claim 1, wherein a total area of the sub-pixels included in the first pixel, the second pixel, and the third pixel capable of displaying the first color, a total area of the sub-pixels included in the first pixel, the second pixel, and the third pixel capable of displaying the second color, and a total area of the sub-pixels included in the first pixel, the second pixel, and the third pixel capable of displaying the third color are equal to one another.

* * * * *